(12) United States Patent
Yang

(10) Patent No.: US 12,126,935 B2
(45) Date of Patent: Oct. 22, 2024

(54) IMAGE DISPLAY APPARATUS

(71) Applicant: LG ELECTRONICS INC., Seoul (KR)

(72) Inventor: Junchul Yang, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 181 days.

(21) Appl. No.: 17/922,332

(22) PCT Filed: Apr. 28, 2020

(86) PCT No.: PCT/KR2020/005588
§ 371 (c)(1),
(2) Date: Oct. 28, 2022

(87) PCT Pub. No.: WO2021/221193
PCT Pub. Date: Nov. 4, 2021

(65) Prior Publication Data
US 2023/0179738 A1     Jun. 8, 2023

(51) Int. Cl.
*H04N 7/10*      (2006.01)
*H04N 17/04*      (2006.01)
*H04N 21/4425*      (2011.01)

(52) U.S. Cl.
CPC ............. *H04N 7/104* (2013.01); *H04N 17/04* (2013.01); *H04N 21/4425* (2013.01)

(58) Field of Classification Search
CPC .... H04N 7/104; H04N 17/04; H04N 21/4425; H04N 21/436; H04N 21/43635;
(Continued)

(56) References Cited

U.S. PATENT DOCUMENTS

2009/0115753 A1* 5/2009 Chen ...................... G09G 5/003
                                                             345/204
2011/0115983 A1* 5/2011 Nishihata ............. H04N 9/3147
                                                             348/E5.057
(Continued)

FOREIGN PATENT DOCUMENTS

JP      2001339415      12/2001
JP      2014172405      9/2014
(Continued)

OTHER PUBLICATIONS

PCT International Application No. PCT/KR2020/005588, International Search Report dated Jan. 20, 2021, 3 pages.

*Primary Examiner* — Alvaro E Fortich
(74) *Attorney, Agent, or Firm* — LEE, HONG, DEGERMAN, KANG & WAIMEY

(57) ABSTRACT

The present disclosure relates to an image display apparatus. The image display apparatus according to one embodiment of the present disclosure comprises a plurality of input terminals; and a switching circuit including a first receiving end to receive a signal through a first input terminal among the plurality of input terminals, a second receiving end to receive a signal through a second input terminal among the plurality of input terminals, a first transmitting end to transmit a signal received through the first or the second receiving end to a signal processor, and a second transmitting end to output an output signal to the first input terminal in response to a cable being connected between the first and the second input terminal, and a signal being not received. Accordingly, it is possible to determine whether a cable connected to an input terminal is defective.

18 Claims, 15 Drawing Sheets

(58) Field of Classification Search
CPC ........... G09G 2330/12; G09G 2370/12; G09G 5/006; G01R 31/08
See application file for complete search history.

(56) References Cited

U.S. PATENT DOCUMENTS

| | | | |
|---|---|---|---|
| 2018/0262732 A1* | 9/2018 | Urabe | H04N 9/8205 |
| 2019/0057652 A1* | 2/2019 | Lee | H04N 5/57 |
| 2019/0114962 A1* | 4/2019 | Jang | G09G 3/2096 |

FOREIGN PATENT DOCUMENTS

| | | |
|---|---|---|
| JP | 2019078808 | 5/2019 |
| KR | 1020120032789 | 4/2012 |
| KR | 101779710 | 10/2017 |

* cited by examiner

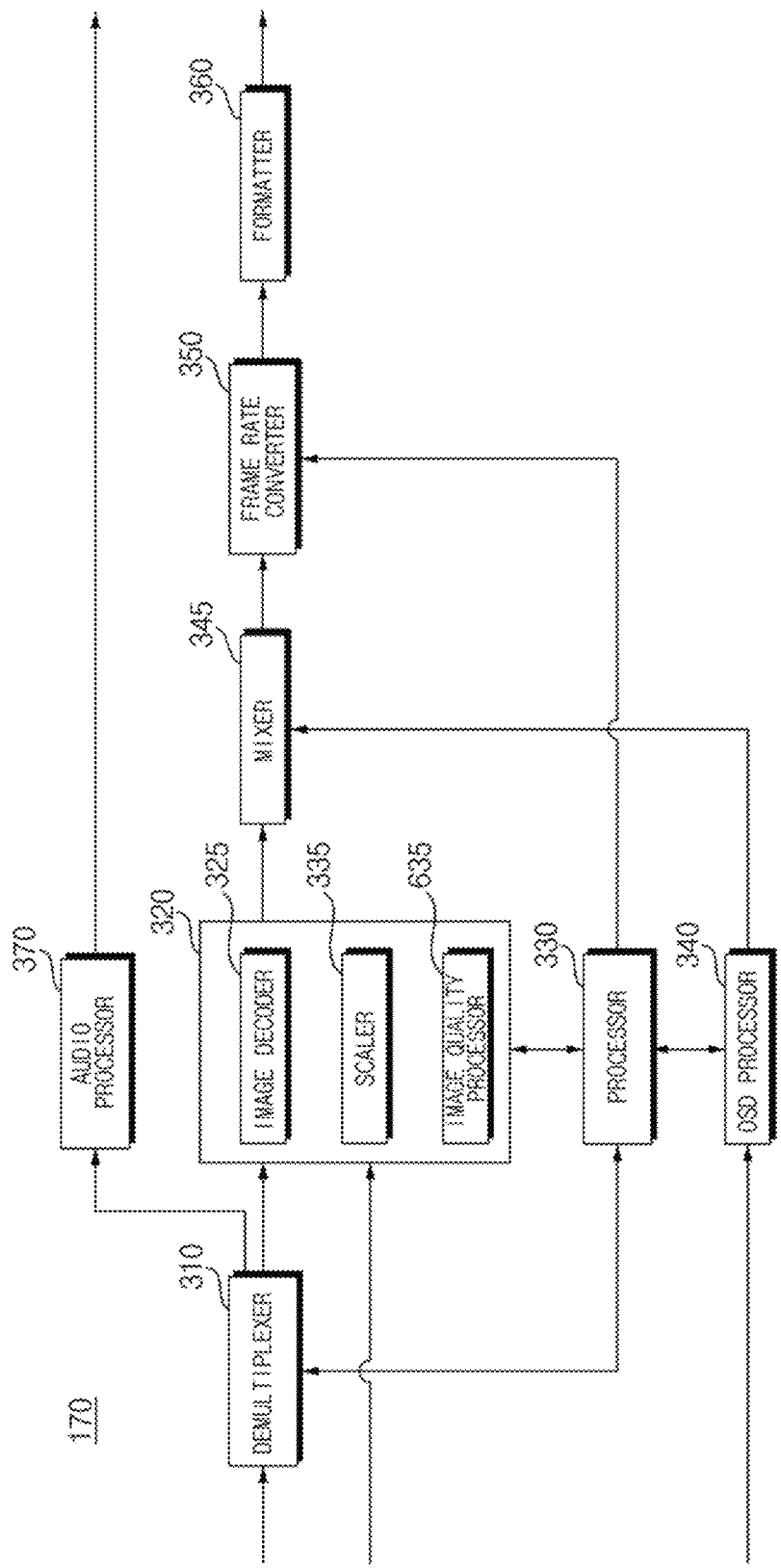

(a) (b) (c)

IMAGE DISPLAY APPARATUS

CROSS-REFERENCE TO RELATED APPLICATIONS

This application is the National Stage filing under 35 U.S.C. 371 of International Application No. PCT/KR2020/005588, filed on Apr. 28, 2020, the contents of which are all incorporated by reference herein in their entirety.

BACKGROUND OF THE DISCLOSURE

1. Field of the Disclosure

The present disclosure relates to an image display apparatus, and more particularly, to an image display apparatus capable of determining whether a cable connected to an input terminal is defective.

2. Description of the Related Art

An image display apparatus is a device having a function of providing an image that a user watches. The user may watch various images through the image display apparatus.

Meanwhile, the image display apparatus may receive and display a signal input through a cable from an external apparatus.

For example, a signal received from a set-top box through a cable may be displayed on the image display apparatus.

At this time, if the cable is defective, the image displayed on the image display apparatus flickers, or the image is not displayed.

In this case, it is difficult to determine whether the cable or the external apparatus is defective.

SUMMARY

An object of the present disclosure is to provide an image display apparatus capable of determining a defect of a cable connected to an input terminal.

To achieve the object above, an image display apparatus according to one embodiment of the present disclosure comprises a plurality of input terminals; and a switching circuit including a first receiving end configured to receive a signal through a first input terminal among the plurality of input terminals, a second receiving end configured to receive a signal through a second input terminal among the plurality of input terminals, a first transmitting end configured to transmit a signal received through the first receiving end or the second receiving end to a signal processor, and a second transmitting end configured to output an output signal to the first input terminal in response to a cable being connected between the first input terminal and the second input terminal, and a signal being not received.

Meanwhile, in response to the cable being connected between the first input terminal and the second input terminal, and a signal being not received, the switching circuit may compare an output signal output to the first input terminal with an input signal received through the second receiving end and, in response to the difference between the output signal and the input signal being more than a predetermined value, determine that the cable is defective.

The image display apparatus according to one embodiment of the present disclosure may further include the signal processor which, in response to the cable being connected between the first input terminal and the second input terminal, and a signal being not received, compare an output signal output to the first input terminal with an input signal received through the second receiving end and, in response to the difference between the output signal and the input signal being more than a predetermined value, determines that the cable is defective.

Meanwhile, in response to a first cable connected to an external apparatus being connected to the first input terminal, the switching circuit may transmit a signal received through the first cable to the signal processor through the first receiving end and the first transmitting end.

Meanwhile, in response to a second cable connected to a second external apparatus being connected to the second input terminal, the switching circuit may transmit a signal received through the second cable to the signal processor through the second receiving end and the first transmitting end.

Meanwhile, in response to the first cable connected to the external apparatus being connected to the first input terminal, and the second cable connected to the second external apparatus being connected to the second input terminal, the switching circuit may transmit a signal received through the first receiving end and a signal received through the second receiving end to the signal processor through the first transmitting end using time division.

Meanwhile, the first transmitting end is electrically connected to the signal processor, and the second transmitting end is not electrically connected to the signal processor.

Meanwhile, the first transmitting end is electrically connected to the first receiving end and the second receiving end, and the second transmitting end is not electrically connected to the second receiving end.

Meanwhile, the image display apparatus according to one embodiment of the present disclosure may further include an electrical line connecting the second transmitting end and a first node between the first receiving end and the first input terminal.

Meanwhile, the image display apparatus according to one embodiment of the present disclosure may further include a display configured to display a screen display stop message or a cable defect message in response to a determination that the cable is defective.

Meanwhile, the signal processor may control to display a screen display stop message or a cable defect message in response to a determination that the cable is defective.

Meanwhile, an image display apparatus according to another embodiment of the present disclosure comprises a plurality of input terminals; and a switching circuit configured to, in response to receiving a signal through a first input terminal or a second input terminal among the plurality of input terminals, operate in a normal mode and transmit the received signal to a signal processor through a first transmitting end, and in response to a cable being connected between the first input terminal and the second input terminal, and a signal being not received, enter a check mode and output a test signal to the first input terminal.

Meanwhile, the switching circuit may compare a signal received through the second input terminal with the test signal in response to the test signal in the check mode and, in response to the difference between the output signal and the input signal being more than a predetermined value, determine that the cable is defective.

Meanwhile, the image display apparatus according to another embodiment of the present disclosure may further include the signal processor which compares a signal received through the second input terminal with the test signal in response to the test signal in the check mode and, in response to the difference between the output signal and the input signal being more than a predetermined value, determines that the cable is defective.

Effects of the Disclosure

An image display apparatus according to one embodiment of the present disclosure comprises a plurality of input terminals; and a switching circuit including a first receiving end configured to receive a signal through a first input terminal among the plurality of input terminals, a second receiving end configured to receive a signal through a second input terminal among the plurality of input terminals, a first transmitting end configured to transmit a signal received through the first receiving end or the second receiving end to a signal processor, and a second transmitting end configured to output an output signal to the first input terminal in response to a cable being connected between the first input terminal and the second input terminal, and a signal being not received. Accordingly, it is possible to determine whether a cable connected to an input terminal is defective.

Meanwhile, in response to the cable being connected between the first input terminal and the second input terminal, and a signal being not received, the switching circuit may compare an output signal output to the first input terminal with an input signal received through the second receiving end and, in response to the difference between the output signal and the input signal being more than a predetermined value, determine that the cable is defective. Accordingly, it is possible to determine whether a cable connected to an input terminal is defective.

The image display apparatus according to one embodiment of the present disclosure may further include the signal processor which, in response to the cable being connected between the first input terminal and the second input terminal, and a signal being not received, compare an output signal output to the first input terminal with an input signal received through the second receiving end and, in response to the difference between the output signal and the input signal being more than a predetermined value, determines that the cable is defective. Accordingly, it is possible to determine whether a cable connected to an input terminal is defective.

Meanwhile, in response to a first cable connected to an external apparatus being connected to the first input terminal, the switching circuit may transmit a signal received through the first cable to the signal processor through the first receiving end and the first transmitting end. Accordingly, a signal received through the first input terminal may be processed.

Meanwhile, in response to a second cable connected to a second external apparatus being connected to the second input terminal, the switching circuit may transmit a signal received through the second cable to the signal processor through the second receiving end and the first transmitting end. Accordingly, a signal received through the second input terminal may be processed.

Meanwhile, in response to the first cable connected to the external apparatus being connected to the first input terminal, and the second cable connected to the second external apparatus being connected to the second input terminal, the switching circuit may transmit a signal received through the first receiving end and a signal received through the second receiving end to the signal processor through the first transmitting end using time division. Accordingly, a signal received through the first input terminal and the second input terminal may be processed.

Meanwhile, the first transmitting end is electrically connected to the signal processor, and the second transmitting end is not electrically connected to the signal processor. Accordingly, a signal received through the first input terminal or the second input terminal may be processed.

Meanwhile, the first transmitting end is electrically connected to the first receiving end and the second receiving end, and the second transmitting end is not electrically connected to the second receiving end. Accordingly, it is possible to easily check whether a cable is defective.

Meanwhile, the image display apparatus according to one embodiment of the present disclosure may further include an electrical line connecting the second transmitting end and a first node between the first receiving end and the first input terminal. Accordingly, it is possible to easily check whether a cable is defective.

Meanwhile, the image display apparatus according to one embodiment of the present disclosure may further include a display configured to display a screen display stop message or a cable defect message in response to a determination that the cable is defective. Accordingly, it is possible to easily check whether a cable is defective.

Meanwhile, the signal processor may control to display a screen display stop message or a cable defect message in response to a determination that the cable is defective. Accordingly, it is possible to easily check whether a cable is defective.

Meanwhile, an image display apparatus according to another embodiment of the present disclosure comprises a plurality of input terminals; and a switching circuit configured to, in response to receiving a signal through a first input terminal or a second input terminal among the plurality of input terminals, operate in a normal mode and transmit the received signal to a signal processor through a first transmitting end, and in response to a cable being connected between the first input terminal and the second input terminal, and a signal being not received, enter a check mode and output a test signal to the first input terminal. Accordingly, it is possible to determine whether a cable connected to an input terminal is defective.

Meanwhile, the switching circuit may compare a signal received through the second input terminal with the test signal in response to the test signal in the check mode and, in response to the difference between the output signal and the input signal being more than a predetermined value, determine that the cable is defective. Accordingly, it is possible to determine whether a cable connected to an input terminal is defective.

Meanwhile, the image display apparatus according to another embodiment of the present disclosure may further include the signal processor which compares a signal received through the second input terminal with the test signal in response to the test signal in the check mode and, in response to the difference between the output signal and the input signal being more than a predetermined value, determines that the cable is defective. Accordingly, it is possible to determine whether a cable connected to an input terminal is defective.

BRIEF DESCRIPTION OF THE DRAWINGS

FIG. 3 is an example of an internal block diagram of the signal processor in FIG. 2.

DETAILED DESCRIPTION OF THE PREFERRED EMBODIMENTS

Hereinafter, the present disclosure will be described in detail with reference to the accompanying drawings.

With respect to constituent elements used in the following description, suffixes "module" and "unit" are given only in consideration of ease in the preparation of the specification, and do not have or serve as different meanings. Accordingly, the suffixes "module" and "unit" may be used interchangeably.

Figure 1:
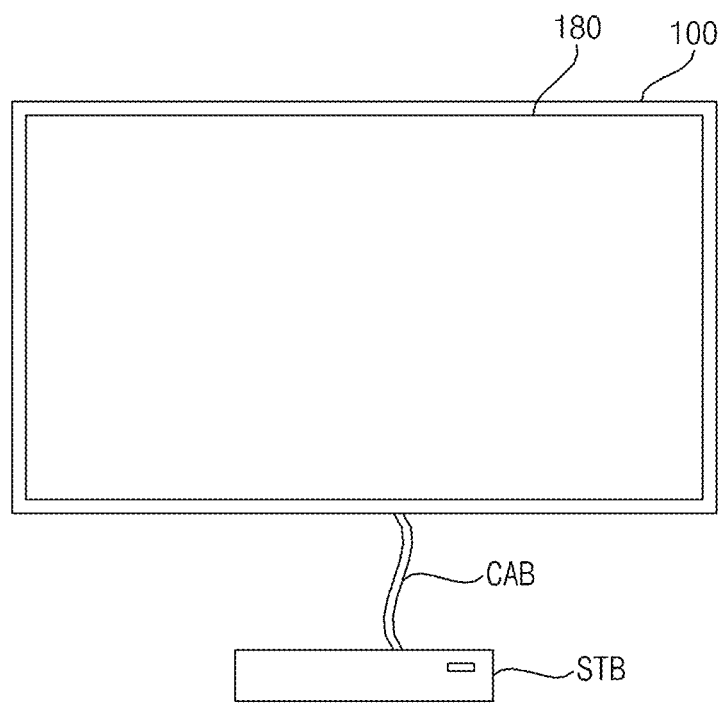
FIG. 1 is a diagram showing an image display system according to an embodiment of the present disclosure.

FIG. 1 is a diagram showing an image display apparatus according to an embodiment of the present disclosure.

Referring to the drawing, an image display apparatus 100 may include a display 180.

The display 180 may be implemented with any one of various panels. For example, the display 180 may be any one of a liquid crystal display panel (LCD panel), an organic light emitting diode panel (OLED panel), an inorganic light emitting diode panel (LED panel).

The image display apparatus 100 may be connected to an external apparatus through a cable CAB. In addition, the image display apparatus 100 may process a signal received from the external apparatus STB to display an image or output a sound.

On the other hand, if an image displayed on the image display apparatus 100 flickers or the image is not displayed while the image display apparatus 100 is connected to the external apparatus STB, it is difficult to determine whether the external apparatus STB or the cable CAB is defective.

Accordingly, the present disclosure proposes a method for determining whether a cable CAB is defective.

To this end, an image display apparatus 100 according to one embodiment of the present disclosure comprises a plurality of input terminals; and a switching circuit 710 including a first receiving end RX1 receiving a signal through a first input terminal 715 among the plurality of input terminals, a second receiving end RX2 receiving a signal through a second input terminal 717 among the plurality of input terminals, a first transmitting end TX1 transmitting a signal received through the first receiving end RX1 or the second receiving end RX2 to a signal processor 170, and a second transmitting end TX2 outputting an output signal to the first input terminal 715 when a cable CAB is connected between the first input terminal 715 and the second input terminal 717, and a signal is not received. Accordingly, it is possible to determine whether a cable CAB connected to an input terminal is defective.

Meanwhile, when a cable CAB is connected between the first input terminal 715 and the second input terminal 717, and a signal is not received, the switching circuit 710 may compare an output signal output to the first input terminal 715 with an input signal received through the second receiving end RX2 and, in response to the difference between the output signal and the input signal being more than a predetermined value, determine that the cable CAB is defective. Accordingly, it is possible to determine whether a cable CAB connected to an input terminal is defective.

The image display apparatus 100 according to one embodiment of the present disclosure may further include the signal processor 170 which, when a cable CAB is connected between the first input terminal 715 and the second input terminal 717, and a signal is not received, compare an output signal output to the first input terminal 715 with an input signal received through the second receiving end RX2 and, in response to the difference between the output signal and the input signal being more than a predetermined value, determines that the cable CAB is defective. Accordingly, it is possible to determine whether a cable CAB connected to an input terminal is defective.

Meanwhile, an image display apparatus 100 according to another embodiment of the present disclosure comprises a plurality of input terminals; and a switching circuit 710, in response to receiving a signal through a first input terminal 715 or a second input terminal 717 among the plurality of input terminals, operates in a normal mode and transmits the received signal to a signal processor 170 through a first transmitting end TX1 and enters a check mode and outputs a test signal to the first input terminal 715 when a cable CAB is connected between the first input terminal 715 and the second input terminal 717, and a signal is not received. Accordingly, it is possible to determine whether a cable CAB connected to an input terminal is defective.

Meanwhile, the switching circuit 710 may compare a signal received through the second input terminal 717 with the test signal in response to the test signal in the check mode and, in response to the difference between the output signal and the input signal being more than a predetermined value, determine that the cable CAB is defective. Accordingly, it is possible to determine whether a cable CAB connected to an input terminal is defective.

Meanwhile, the image display apparatus 100 according to another embodiment of the present disclosure may further include a signal processor 170 which compares a signal received through the second input terminal 717 with the test signal in response to the test signal in the check mode and, in response to the difference between the output signal and the input signal being more than a predetermined value, determines that the cable CAB is defective. Accordingly, it is possible to determine whether a cable CAB connected to an input terminal is defective.

Various operating methods of operating the image display apparatus 100 will be described in detail with reference to FIG. 8 and subsequent drawings thereof.

Meanwhile, the image display apparatus 100 in FIG. 1 may be a monitor, a TV, a tablet PC, a mobile terminal, a display for a vehicle, etc.

Figure 2:
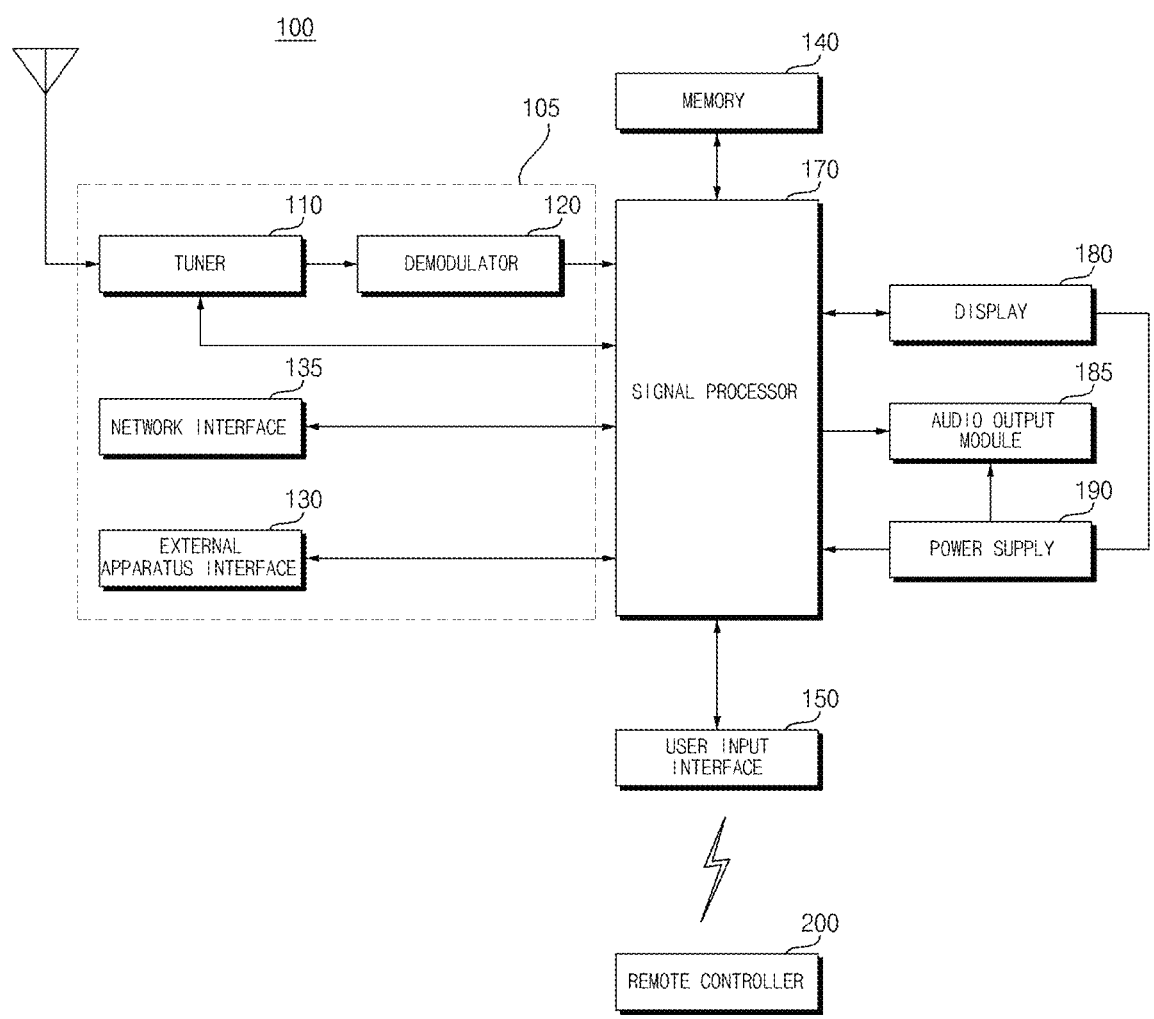
FIG. 2 is an example of an internal block diagram of the image display apparatus of FIG. 1.

FIG. 2 is an example of an internal block diagram of the image display apparatus of FIG. 1.

Referring to FIG. 2, the image display apparatus 100 according to an embodiment of the present disclosure includes an image receiver 105, an external apparatus interface 130, a memory 140, a user input interface 150, a sensor device (not shown), a signal processor 170, a display 180, and an audio output device 185.

The image receiver 105 may include a tuner 110, a demodulator 120, a network interface 135, and an external apparatus interface 130.

Meanwhile, unlike the drawing, the image receiver 105 may include only the tuner 110, the demodulator 120, and the external apparatus interface 130. That is, the network interface 135 may not be included.

The tuner 110 selects an RF broadcast signal corresponding to a channel selected by a user or all prestored channels among radio frequency (RF) broadcast signals received through an antenna (not shown). In addition, the selected RF broadcast signal is converted into an intermediate frequency signal, a baseband image, or an audio signal.

For example, if the selected RF broadcast signal is a digital broadcast signal, it is converted into a digital IF signal (DIF). If the selected RF broadcast signal is an analog broadcast signal, it is converted into an analog baseband image or audio signal (CVBS/SIF). That is, the tuner 110 can process a digital broadcast signal or an analog broadcast signal. The analog baseband image or audio signal (CVBS/SIF) output from the tuner 110 may be directly input to the signal processor 170.

Meanwhile, the tuner 110 can include a plurality of tuners for receiving broadcast signals of a plurality of channels. Alternatively, a single tuner that simultaneously receives broadcast signals of a plurality of channels is also available.

The demodulator 120 receives the converted digital IF signal DIF from the tuner 110 and performs a demodulation operation.

The demodulator 120 may perform demodulation and channel decoding and then output a stream signal TS. At this time, the stream signal may be a multiplexed signal of an image signal, an audio signal, or a data signal.

The stream signal output from the demodulator 120 may be input to the signal processor 170. The signal processor 170 performs demultiplexing, image/audio signal processing, and the like, and then outputs an image to the display 180 and outputs audio to the audio output device 185.

The external apparatus interface 130 may transmit or receive data with a connected external apparatus (not shown), e.g., a set-top box 50. To this end, the external apparatus interface 130 may include an A/V input and output device (not shown).

The external apparatus interface 130 may be connected in wired or wirelessly to an external apparatus such as a digital versatile disk (DVD), a Blu ray, a game equipment, a camera, a camcorder, a computer(notebook), and a set-top box, and may perform an input/output operation with an external apparatus.

The A/V input and output device may receive image and audio signals from an external apparatus. Meanwhile, a wireless transceiver (not shown) may perform short range wireless communication with other electronic apparatus.

Through the wireless transceiver (not shown), the external apparatus interface 130 may exchange data with an adjacent mobile terminal 600. In particular, in a mirroring mode, the external apparatus interface 130 may receive device information, executed application information, application image, and the like from the mobile terminal 600.

The network interface 135 provides an interface for connecting the image display apparatus 100 to a wired/wireless network including the Internet network. For example, the network interface 135 may receive, via the network, content or data provided by the Internet, a content provider, or a network operator.

Meanwhile, the network interface 135 may include a wireless transceiver (not shown).

The memory 140 may store a program for each signal processing and control in the signal processor 170, and may store signal processed image, audio, or data signal.

In addition, the memory 140 may serve to temporarily store image, audio, or data signal input to the external apparatus interface 130. In addition, the memory 140 may store information on a certain broadcast channel through a channel memory function such as a channel map.

Although FIG. 2 illustrates that the memory is provided separately from the signal processor 170, the scope of the present disclosure is not limited thereto. The memory 140 may be included in the signal processor 170.

The user input interface 150 transmits a signal input by the user to the signal processor 170 or transmits a signal from the signal processor 170 to the user.

For example, it may transmit/receive a user input signal such as power on/off, channel selection, screen setting, etc., from a remote controller 200, may transfer a user input signal input from a local key (not shown) such as a power key, a channel key, a volume key, a set value, etc., to the signal processor 170, may transfer a user input signal input from a sensor device (not shown) that senses a user's gesture to the signal processor 170, or may transmit a signal from the signal processor 170 to the sensor device (not shown).

The signal processor 170 may demultiplex the input stream through the tuner 110, the demodulator 120, the network interface 135, or the external apparatus interface 130, or process the demultiplexed signals to generate and output a signal for image or audio output.

For example, the signal processor 170 is configured to receive a broadcast signal received by the image receiver 105 or an HDMI signal and perform signal processing based on the received broadcast signal or the HDMI signal to thereby output a processed image signal.

The image signal processed by the signal processor 170 is input to the display 180 and may be displayed as an image corresponding to the image signal. In addition, the image signal processed by the signal processor 170 may be input to the external output apparatus through the external apparatus interface 130.

The audio signal processed by the signal processor 170 may be output to the audio output device 185 as an audio signal. In addition, audio signal processed by the signal processor 170 may be input to the external output apparatus through the external apparatus interface 130.

Although not shown in FIG. 2, the signal processor 170 may include a demultiplexer, an image processor, and the like. That is, the signal processor 170 may perform a variety of signal processing and thus it may be implemented in the form of a system on chip (SOC). This will be described later with reference to FIG. 3.

In addition, the signal processor 170 can control the overall operation of the image display apparatus 100. For example, the signal processor 170 may control the tuner 110 to control the tuning of the RF broadcast corresponding to the channel selected by the user or the previously stored channel.

In addition, the signal processor 170 may control the image display apparatus 100 according to a user command input through the user input interface 150 or an internal program.

Meanwhile, the signal processor 170 may control the display 180 to display an image. At this time, the image displayed on the display 180 may be a still image or a moving image and may be a 2D image or a 3D image.

Meanwhile, the signal processor 170 may display a certain object in an image displayed on the display 180. For example, the object may be at least one of a connected web screen (newspaper, magazine, etc.), an electronic program guide (EPG), various menus, a widget, an icon, a still image, a moving image, or a text.

Meanwhile, the signal processor 170 may recognize the position of the user based on the image photographed by a photographing device (not shown). For example, the distance (z-axis coordinate) between a user and the image display apparatus 100 can be determined. In addition, the x-axis coordinate and the y-axis coordinate in the display 180 corresponding to a user position can be determined.

The display 180 generates a driving signal by converting an image signal, a data signal, an OSD signal, a control signal processed by the signal processor 170, an image signal, a data signal, a control signal, and the like received from the external apparatus interface 130.

Meanwhile, the display 180 may be configured as a touch screen and used as an input device in addition to an output device.

The audio output device 185 receives a signal processed by the signal processor 170 and outputs it as an audio.

The photographing device (not shown) photographs a user. The photographing device (not shown) may be implemented by a single camera, but the present disclosure is not limited thereto and may be implemented by a plurality of cameras. Image information photographed by the photographing device (not shown) may be input to the signal processor 170.

The signal processor 170 may sense a gesture of the user based on each of the images photographed by the photographing device (not shown), the signals detected from the sensor device (not shown), or a combination thereof.

The power supply 190 supplies corresponding power to the image display apparatus 100. Particularly, the power may be supplied to a controller 170 which can be implemented in the form of a system on chip (SOC), a display 180 for displaying an image, and an audio output device 185 for outputting an audio.

Specifically, the power supply 190 may include a converter for converting an AC power into a DC power, and a DC/DC converter for converting the level of the DC power.

The remote controller 200 transmits the user input to the user input interface 150. To this end, the remote controller 200 may use Bluetooth, a radio frequency (RF) communication, an infrared (IR) communication, an Ultra Wideband (UWB), ZigBee, or the like. In addition, the remote controller 200 may receive the image, audio, or data signal output from the user input interface 150 and display it on the remote controller 200 or output it as an audio.

Meanwhile, the image display apparatus 100 may be a fixed or mobile digital broadcasting receiver capable of receiving digital broadcasting.

Meanwhile, a block diagram of the image display apparatus 100 shown in FIG. 2 is a block diagram for an embodiment of the present disclosure. Each component of the block diagram may be integrated, added, or omitted according to a specification of the image display apparatus 100 actually implemented. That is, two or more components may be combined into a single component as needed, or a single component may be divided into two or more components. The function performed in each block is described for the purpose of illustrating embodiments of the present disclosure, and specific operation and apparatus do not limit the scope of the present disclosure.

FIG. 3 is an example of an internal block diagram of the signal processor in FIG. 2.

Referring to the drawing, the signal processor 170 according to an embodiment of the present disclosure may include a demultiplexer 310, an image processor 320, a processor 330, and an audio processor 370. In addition, the signal processor 170 may further include and a data processor (not shown).

The demultiplexer 310 demultiplexes the input stream. For example, when an MPEG-2 TS is input, it can be demultiplexed into image, audio, and data signal, respectively. Here, the stream signal input to the demultiplexer 310 may be a stream signal output from the tuner 110, the demodulator 120, or the external apparatus interface 130.

The image processor 320 may perform signal processing on an input image. For example, the image processor 320 may perform image processing on an image signal demultiplexed by the demultiplexer 310.

To this end, the image processor 320 may include an image decoder 325, a scaler 335, an image quality processor 635, an image encoder (not shown), an OSD processor 340, a frame rate converter 350, a formatter 360, etc.

The image decoder 325 decodes a demultiplexed image signal, and the scaler 335 performs scaling so that the resolution of the decoded image signal can be output from the display 180.

The image decoder 325 can include a decoder of various standards. For example, a 3D image decoder for MPEG-2, H.264 decoder, a color image, and a depth image, and a decoder for a multiple view image may be provided.

The scaler 335 may scale an input image signal decoded by the image decoder 325 or the like.

For example, if the size or resolution of an input image signal is small, the scaler 335 may upscale the input image signal, and, if the size or resolution of the input image signal is great, the scaler 335 may downscale the input image signal.

The image quality processor 635 may perform image quality processing on an input image signal decoded by the image decoder 325 or the like.

For example, the image quality processor 625 may perform noise reduction processing on an input image signal, extend a resolution of high gray level of the input image signal, perform image resolution enhancement, perform signal processing based on high dynamic range (HDR), change a frame rate, perform image quality processing suitable for properties of a panel, especially an OLED panel, etc.

The OSD processor 340 generates an OSD signal according to a user input or by itself. For example, based on a user input signal, the OSD processor 340 may generate a signal for displaying various pieces of information as a graphic or a text on the screen of the display 180. The generated OSD signal may include various data such as a user interface screen of the image display apparatus 100, various menu screens, a widget, and an icon. In addition, the generated OSD signal may include a 2D object or a 3D object.

In addition, the OSD processor 340 may generate a pointer that can be displayed on the display, based on a pointing signal input from the remote controller 200. In particular, such a pointer may be generated by a pointing signal processor, and the OSD processor 340 may include such a pointing signal processor (not shown). Obviously, the pointing signal processor (not shown) may be provided separately from the OSD processor 340.

A frame rate converter (FRC) 350 may convert a frame rate of an input image. The FRC 350 may output the input image without changes.

Meanwhile, the formatter 360 may change a format of an input image signal into a format suitable for displaying the image signal on a display and output the image signal in the changed format.

In particular, the formatter 360 may change a format of an image signal to correspond to a display panel.

Meanwhile, the formatter 360 may change the format of the image signal. For example, it may change the format of the 3D image signal into any one of various 3D formats such as a side by side format, a top/down format, a frame sequential format, an interlaced format, a checker box format, and the like.

The processor 330 may control overall operations of the image display apparatus 100 or the signal processor 170.

For example, the processor 330 may control the tuner 110 to control the tuning of an RF broadcast corresponding to a channel selected by a user or a previously stored channel.

In addition, the processor 330 may control the image display apparatus 100 according to a user command input through the user input interface 150 or an internal program.

In addition, the processor 330 may transmit data to the network interface 135 or to the external apparatus interface 130.

In addition, the processor 330 may control the demultiplexer 310, the image processor 320, and the like in the signal processor 170.

Meanwhile, the audio processor 370 in the signal processor 170 may perform the audio processing of the demultiplexed audio signal. To this end, the audio processor 370 may include various decoders.

In addition, the audio processor 370 in the signal processor 170 may process a base, a treble, a volume control, and the like.

The data processor (not shown) in the signal processor 170 may perform data processing of the demultiplexed data signal. For example, when the demultiplexed data signal is a coded data signal, it can be decoded. The encoded data signal may be electronic program guide information including broadcast information such as a start time and an end time of a broadcast program broadcasted on each channel.

Meanwhile, a block diagram of the signal processor 170 shown in FIG. 3 is a block diagram for an embodiment of the present disclosure. Each component of the block diagram may be integrated, added, or omitted according to a specification of the signal processor 170 actually implemented.

In particular, the frame rate converter 350 and the formatter 360 may be provided separately in addition to the image processor 320.

Figure 4A:
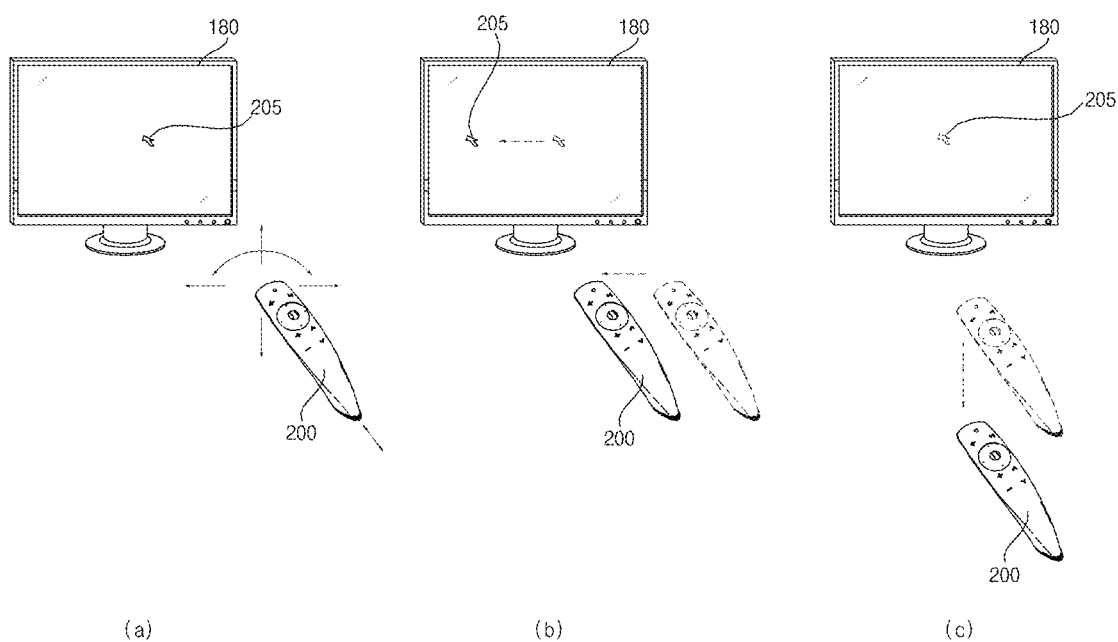
FIG. 4A is a diagram illustrating a control method of a remote controller of FIG. 2.

FIG. 4A is a diagram illustrating a control method of a remote controller of FIG. 2.

As shown in FIG. 4A(a), it is illustrated that a pointer 205 corresponding to the remote controller 200 is displayed on the display 180.

The user may move or rotate the remote controller 200 up and down, left and right (FIG. 4A(b)), and back and forth (FIG. 4A(c)). The pointer 205 displayed on the display 180 of the image display apparatus corresponds to the motion of the remote controller 200. Such a remote controller 200 may be referred to as a space remote controller or a 3D pointing apparatus, because the pointer 205 is moved and displayed according to the movement in a 3D space, as shown in the drawing.

FIG. 4A(b) illustrates that when the user moves the remote controller 200 to the left, the pointer 205 displayed on the display 180 of the image display apparatus also moves to the left correspondingly.

Information on the motion of the remote controller 200 detected through a sensor of the remote controller 200 is transmitted to the image display apparatus. The image display apparatus may calculate the coordinate of the pointer 205 from the information on the motion of the remote controller 200. The image display apparatus may display the pointer 205 to correspond to the calculated coordinate.

FIG. 4A(c) illustrates a case where the user moves the remote controller 200 away from the display 180 while pressing a specific button of the remote controller 200. Thus, a selection area within the display 180 corresponding to the pointer 205 may be zoomed in so that it can be displayed to be enlarged. On the other hand, when the user moves the remote controller 200 close to the display 180, the selection area within the display 180 corresponding to the pointer 205 may be zoomed out so that it can be displayed to be reduced. Meanwhile, when the remote controller 200 moves away from the display 180, the selection area may be zoomed out, and when the remote controller 200 approaches the display 180, the selection area may be zoomed in.

Meanwhile, when the specific button of the remote controller 200 is pressed, it is possible to exclude the recognition of vertical and lateral movement. That is, when the remote controller 200 moves away from or approaches the display 180, the up, down, left, and right movements are not recognized, and only the forward and backward movements are recognized. Only the pointer 205 is moved according to the up, down, left, and right movements of the remote controller 200 in a state where the specific button of the remote controller 200 is not pressed.

Meanwhile, the moving speed or the moving direction of the pointer 205 may correspond to the moving speed or the moving direction of the remote controller 200.

Figure 4B:
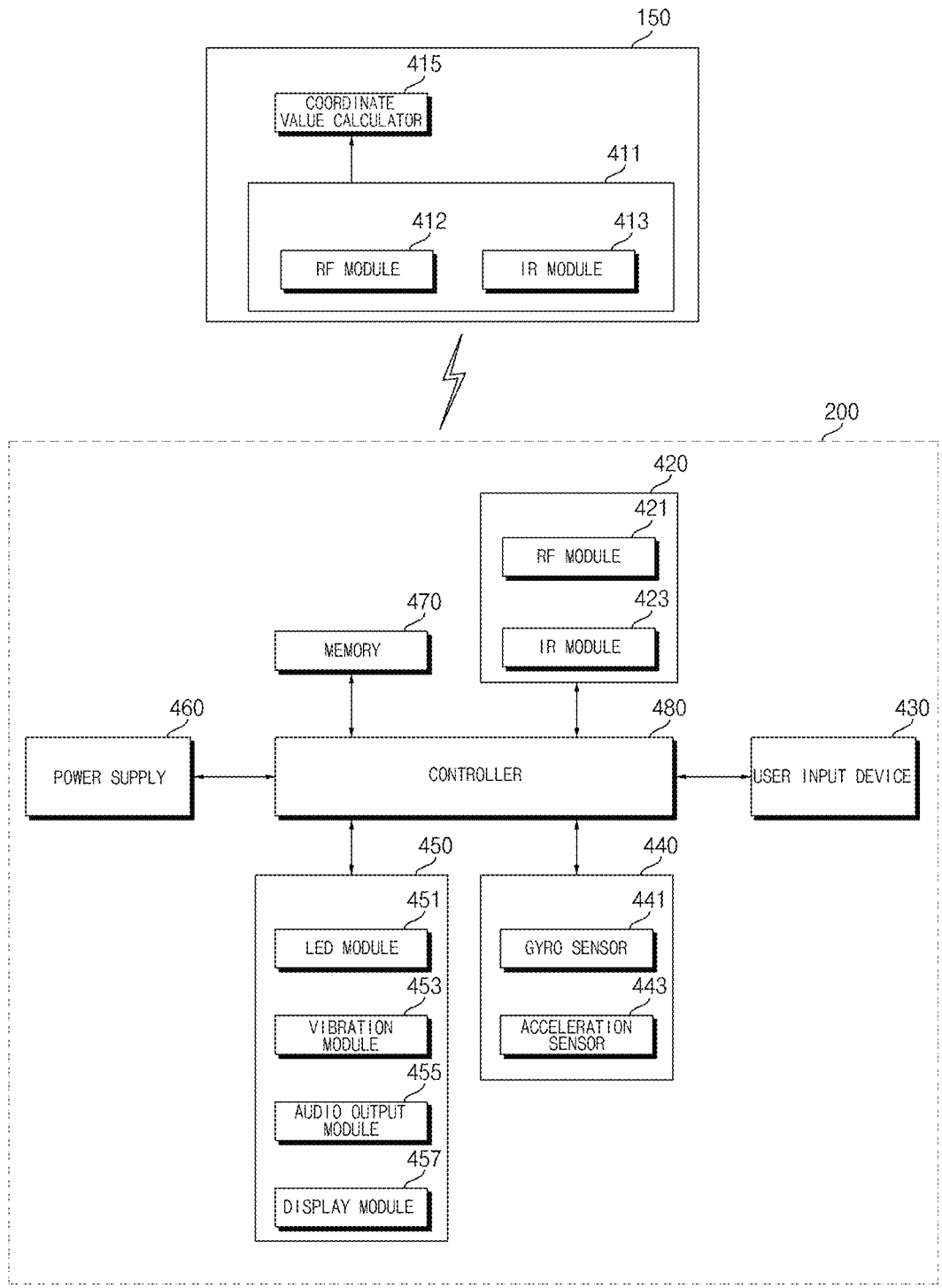
FIG. 4B is an internal block diagram of the remote controller of FIG. 2.

FIG. 4B is an internal block diagram of the remote controller of FIG. 2.

Referring to the drawing, the remote controller 200 includes a wireless transceiver 425, a user input device 435, a sensor device 440, an output device 450, a power supply 460, a memory 470, and a controller 480.

The wireless transceiver 425 transmits/receives a signal to/from any one of the image display apparatuses according to the embodiments of the present disclosure described above. Among the image display apparatuses according to the embodiments of the present disclosure, one image display apparatus 100 will be described as an example.

In the present embodiment, the remote controller 200 may include an RF module 421 for transmitting and receiving signals to and from the image display apparatus 100 according to a RF communication standard. In addition, the remote controller 200 may include an IR module 423 for transmitting and receiving signals to and from the image display apparatus 100 according to an IR communication standard.

In the present embodiment, the remote controller 200 transmits a signal containing information on the motion of the remote controller 200 to the image display apparatus 100 through the RF module 421.

In addition, the remote controller 200 may receive the signal transmitted by the image display apparatus 100 through the RF module 421. In addition, if necessary, the remote controller 200 may transmit a command related to power on/off, channel change, volume change, and the like to the image display apparatus 100 through the IR module 423.

The user input device 435 may be implemented by a keypad, a button, a touch pad, a touch screen, or the like. The user may operate the user input device 435 to input a command related to the image display apparatus 100 to the remote controller 200. When the user input device 435 includes a hard key button, the user can input a command related to the image display apparatus 100 to the remote controller 200 through a push operation of the hard key button. When the user input device 435 includes a touch screen, the user may touch a soft key of the touch screen to input the command related to the image display apparatus 100 to the remote controller 200. In addition, the user input device 435 may include various types of input means such as a scroll key, a jog key, etc., which can be operated by the user, and the present disclosure does not limit the scope of the present disclosure.

The sensor device 440 may include a gyro sensor 441 or an acceleration sensor 443. The gyro sensor 441 may sense information about the motion of the remote controller 200.

For example, the gyro sensor 441 may sense information on the operation of the remote controller 200 based on the x, y, and z axes. The acceleration sensor 443 may sense information on the moving speed of the remote controller 200. Meanwhile, a distance measuring sensor may be further provided, and thus, the distance to the display 180 may be sensed.

The output device 450 may output an image or an audio signal corresponding to the operation of the user input device 435 or a signal transmitted from the image display apparatus 100. Through the output device 450, the user may recognize whether the user input device 435 is operated or whether the image display apparatus 100 is controlled.

For example, the output device 450 may include an LED module 451 that is turned on when the user input device 435 is operated or a signal is transmitted/received to/from the image display apparatus 100 through the wireless transceiver 425, a vibration module 453 for generating a vibration, an audio output device 455 for outputting an audio, or a display module 457 for outputting an image.

The power supply 460 supplies power to the remote controller 200. When the remote controller 200 is not moved for a certain time, the power supply 460 may stop the supply of power to reduce a power waste. The power supply 460 may resume power supply when a certain key provided in the remote controller 200 is operated.

The memory 470 may store various types of programs, application data, and the like necessary for the control or operation of the remote controller 200. If the remote controller 200 wirelessly transmits and receives a signal to/from the image display apparatus 100 through the RF module 421, the remote controller 200 and the image display apparatus 100 transmit and receive a signal through a certain frequency band. The controller 480 of the remote controller 200 may store information about a frequency band or the like for wirelessly transmitting and receiving a signal to/from the image display apparatus 100 paired with the remote controller 200 in the memory 470 and may refer to the stored information.

The controller 480 controls various matters related to the control of the remote controller 200. The controller 480 may transmit a signal corresponding to a certain key operation of the user input device 435 or a signal corresponding to the motion of the remote controller 200 sensed by the sensor device 440 to the image display apparatus 100 through the wireless transceiver 425.

The user input interface 150 of the image display apparatus 100 includes a wireless transceiver 151 that can wirelessly transmit and receive a signal to and from the remote controller 200 and a coordinate value calculator 415 that can calculate the coordinate value of a pointer corresponding to the operation of the remote controller 200.

The user input interface 150 may wirelessly transmit and receive a signal to and from the remote controller 200 through the RF module 412. In addition, the user input interface 150 may receive a signal transmitted by the remote controller 200 through the IR module 413 according to an IR communication standard.

The coordinate value calculator 415 may correct a handshake or an error from a signal corresponding to the operation of the remote controller 200 received through the wireless transceiver 151 and may calculate the coordinate value (x, y) of the pointer 205 to be displayed on the display 180.

The transmission signal of the remote controller 200 inputted to the image display apparatus 100 through the user input interface 150 is transmitted to the controller 180 of the image display apparatus 100. The controller 180 may determine the information on the operation of the remote controller 200 and the key operation from the signal transmitted from the remote controller 200, and, correspondingly, control the image display apparatus 100.

For another example, the remote controller 200 may calculate the pointer coordinate value corresponding to the operation and output it to the user input interface 150 of the image display apparatus 100. In this case, the user input interface 150 of the image display apparatus 100 may transmit information on the received pointer coordinate value to the controller 180 without a separate correction process of handshake or error.

For another example, unlike the drawing, the coordinate value calculator 415 may be provided in the signal processor 170, not in the user input interface 150.

Figure 5:
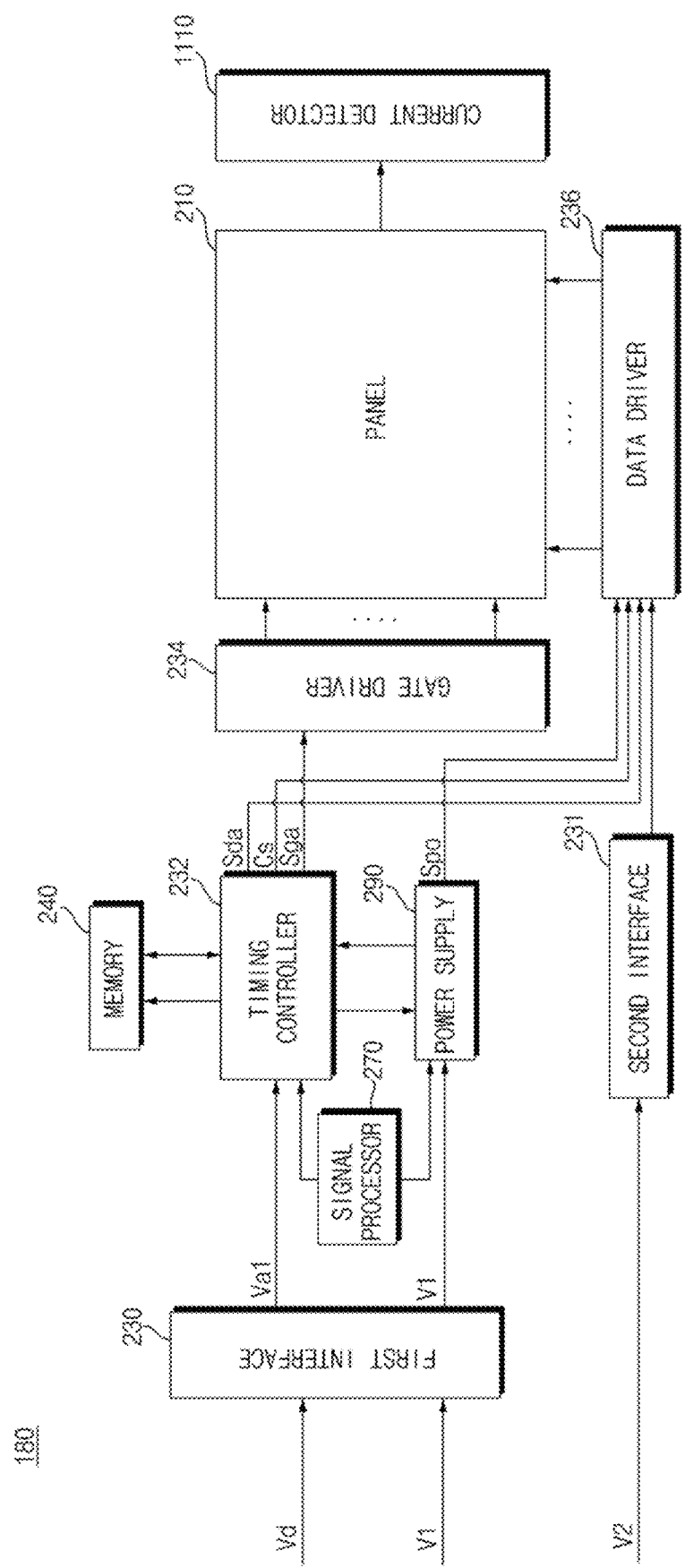
FIG. 5 is an internal block diagram of a display of FIG. 2.

FIG. 5 is an internal block diagram of a display of FIG. 2.

Referring to FIG. 5, the organic display 180 including light emitting diode panel may include an organic light emitting diode panel 210, a first interface 230, a second interface 231, a timing controller 232, a gate driver 234, a data driver 236, a memory 240, a signal processor 270, a power supply 290, a current detector 510, and the like.

The display 180 receives an image signal Vd, a first DC power V1, and a second DC power V2, and may display a certain image based on the image signal Vd.

Meanwhile, the first interface 230 in the display 180 may receive the image signal Vd and the first DC power V1 from the signal processor 170.

Here, the first DC power V1 may be used for the operation of the power supply 290 and the timing controller 232 in the display 180.

Next, the second interface 231 may receive a second DC power V2 from an external power supply 190. Meanwhile, the second DC power V2 may be input to the data driver 236 in the display 180.

The timing controller 232 may output a data driving signal Sda and a gate driving signal Sga, based on the image signal Vd.

For example, when the first interface 230 converts the input image signal Vd and outputs the converted image signal va1, the timing controller 232 may output the data driving signal Sda and the gate driving signal Sga based on the converted image signal va1.

The timing controller 232 may further receive a control signal, a vertical synchronization signal Vsync, and the like, in addition to the image signal Vd from the signal processor 170.

In addition to the image signal Vd, based on a control signal, a vertical synchronization signal Vsync, and the like, the timing controller 232 generates a gate driving signal Sga for the operation of the gate driver 234, and a data driving signal Sda for the operation of the data driver 236.

Meanwhile, the timing controller 232 may further output a control signal Cs to the gate driver 234.

The gate driver 234 and the data driver 236 supply a scan signal and an image signal to the organic light emitting diode panel 210 through a gate line GL and a data line DL respectively, according to the gate driving signal Sga and the data driving signal Sda from the timing controller 232. Accordingly, the organic light emitting diode panel 210 displays a certain image.

Meanwhile, the organic light emitting diode panel 210 may include an organic light emitting layer. In order to display an image, a plurality of gate lines GL and data lines DL may be disposed in a matrix form in each pixel corresponding to the organic light emitting layer.

Meanwhile, the data driver 236 may output a data signal to the organic light emitting diode panel 210 based on a second DC power V2 from the second interface 231.

The power supply 290 may supply various power supplies to the gate driver 234, the data driver 236, the timing controller 232, and the like.

A current detector 1110 may detect the current flowing in a subpixel of the organic light emitting diode panel 210. The detected current may be input to the processor 270 or the like, for an accumulated current calculation.

The signal processor 270 may perform each type of control of the display 180. For example, the processor 270 may control the gate driver 234, the data driver 236, the timing controller 232, and the like.

Meanwhile, the signal processor 270 may receive current information flowing in a subpixel of the organic light emitting diode panel 210 from the current detector 510.

In addition, the signal processor 270 may calculate the accumulated current of each subpixel of the organic light emitting diode panel 210, based on information of current flowing through the subpixel of the organic light emitting diode panel 210. The calculated accumulated current may be stored in the memory 240.

Meanwhile, the signal processor 270 may determine as burn-in, if the accumulated current of each subpixel of the organic light emitting diode panel 210 is equal to or greater than an allowable value.

For example, if the accumulated current of each subpixel of the OLED panel 210 is equal to or higher than 300,000 A, the signal processor 270 may determine that a corresponding subpixel is a burn-in subpixel.

Meanwhile, if the accumulated current of each subpixel of the OLED panel 210 is close to an allowable value, the signal processor 270 may determine that a corresponding subpixel is a subpixel expected to be burn in.

Meanwhile, based on a current detected by the current detector 510, the signal processor 270 may determine that a subpixel having the greatest accumulated current is an expected burn-in subpixel.

Meanwhile, the signal processor 270 may calculate a burn-in subpixel or a burn-in expected subpixel in the organic light emitting diode panel 210 based on current detected by the current detector 1110 and may perform control to allow a current lower than the allocated current to flow in a subpixel around the calculated burn-in subpixel or burn-in expected subpixel. Thus, burn-in of the subpixel around the burn-in subpixel may be extended. As a result, the afterimage of the image display apparatus 100 including the organic light emitting diode panel 210 may be reduced.

The signal processor 270 may perform control to allow a current larger than the allocated current to flow in the calculated burn-in subpixel, and thus, thereby preventing a phenomenon in which a small current flows around the calculated burn-in subpixel and brightness decreases.

When burn-in does not occur in the organic light emitting diode panel 210, the signal processor 270 may perform control to allow a current lower than the allocated current to flow in the subpixel around the burn-in expected subpixel, in which burn-in is expected, and thus, burn-in of the subpixel around the burn-in expected subpixel may be extended. As a result, the afterimage of the image display apparatus 100 including the organic light emitting diode panel 210 may be reduced.

The signal processor 270 may perform control to apply a lower data voltage than an allocated data voltage to the subpixel of the calculated burn-in subpixel or burn-in expected subpixel.

When burn-in does not occur in the organic light emitting diode panel 210, the signal processor 270 may perform control to allow a current lower than the allocated current to flow in the subpixel around the burn-in expected subpixel, in which burn-in is expected, and thus, burn-in of the subpixel around the burn-in expected subpixel may be extended. As a result, the afterimage of the image display apparatus 100 including the organic light emitting diode panel 210 may be reduced.

The signal processor 270 may perform control to allow current of a higher second level than a first level to flow in the subpixel around the calculated burn-in subpixel or burn-in expected subpixel, and thus, a larger amount of current may flow in the second subpixel, the lifespan of which is expected to be relatively long, thereby preventing brightness from being lowered.

The signal processor 270 may calculate a subpixel with the largest amount of accumulated current in the organic light emitting diode panel 210 based on current detected by the current detector 1110 and may perform control to allow a current lower than the allocated current to flow in a subpixel around the subpixel with the largest amount of accumulated current. Thus, the afterimage of the image display apparatus 100 including the organic light emitting diode panel 210 may be reduced.

The signal processor 270 may perform control to allow current of a further lowered level to flow in a subpixel around the subpixel with the largest amount of accumulated current toward the subpixel with the largest amount of accumulated current, and thus, the afterimage of the image display apparatus 100 including the organic light emitting diode panel 210 may be reduced.

An operation of the signal processor 270 or the like will be described in more detail with reference to FIG. 9 and subsequent drawings thereof.

Figure 6A:
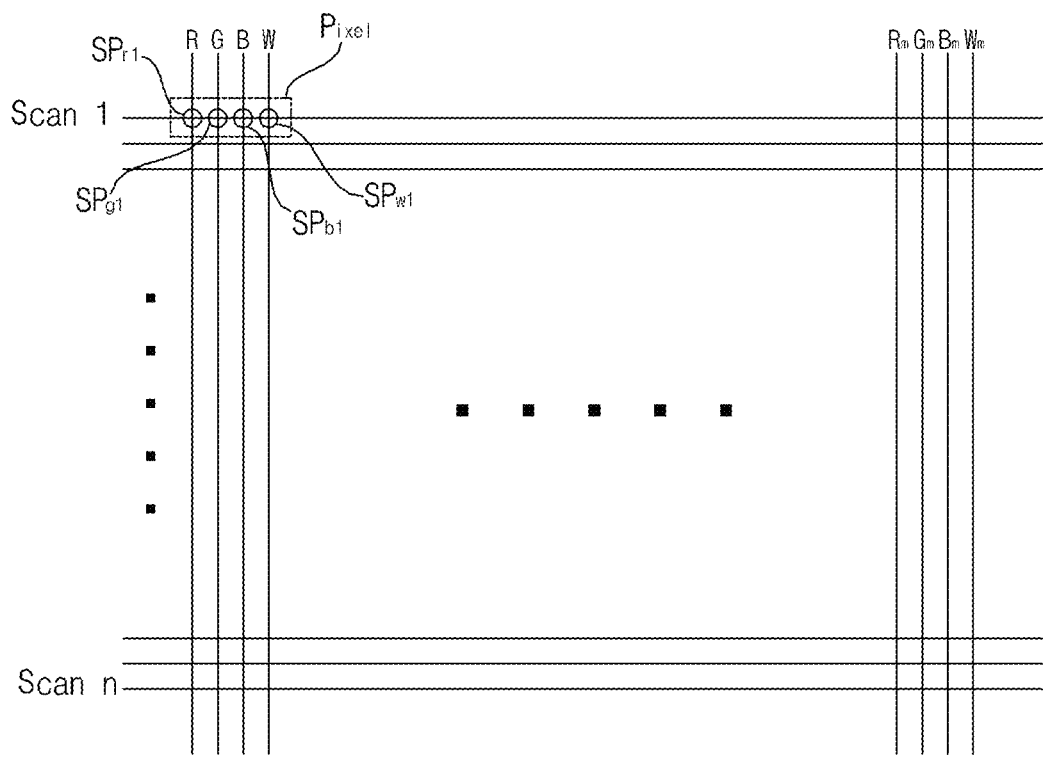
FIG. 6A and FIG. 6B are diagrams referred to in the description of an organic light emitting diode panel of FIG. 5.
Figure 6B:
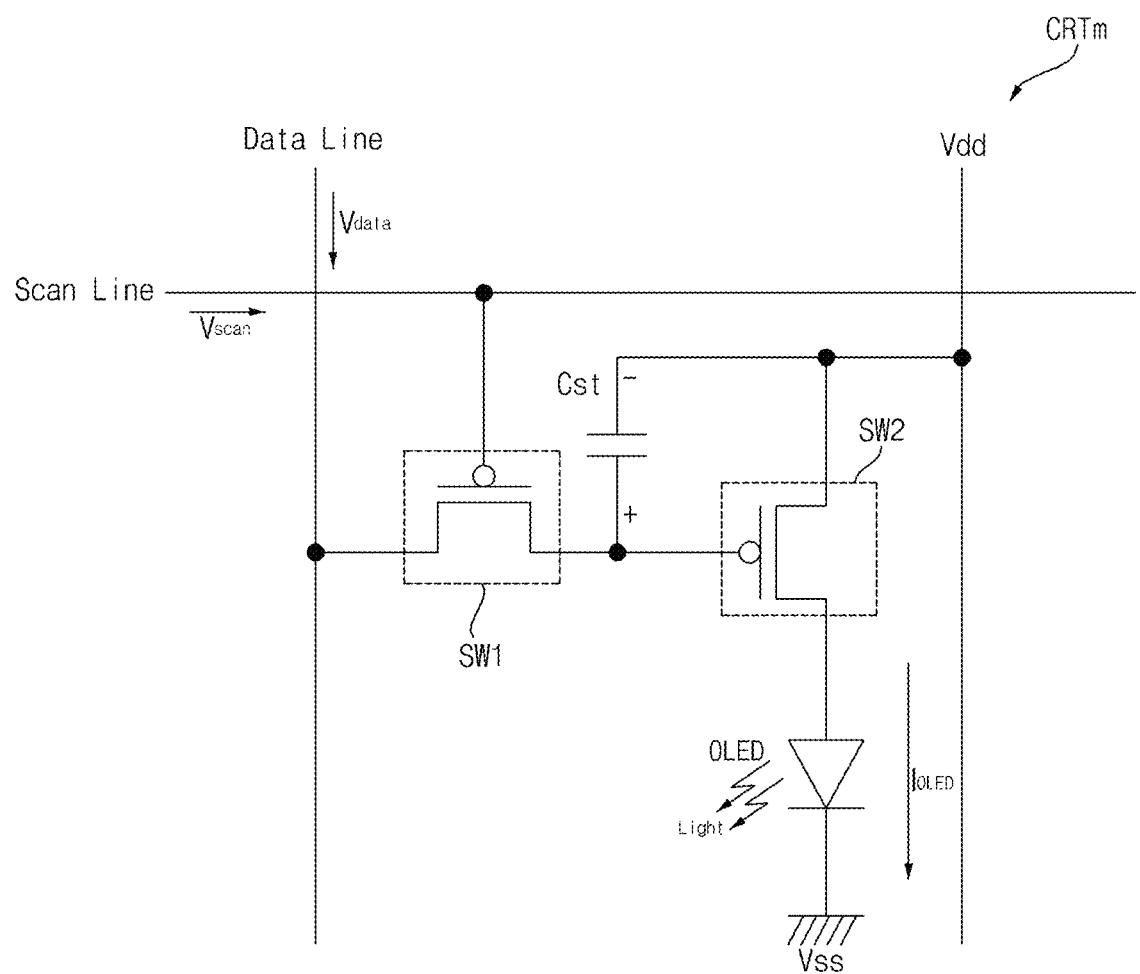

FIG. 6A and FIG. 6B are diagrams referred to in the description of an organic light emitting diode panel of FIG. 5.

Firstly, FIG. 6A is a diagram illustrating a pixel in the organic light emitting diode panel 210.

Referring to drawing, the organic light emitting diode panel 210 may include a plurality of scan lines Scan1 to Scann and a plurality of data lines R1, G1, B1, W1 to Rm, Gm, Bm, Wm intersecting the scan lines.

Meanwhile, a pixel (subpixel) is defined in an intersecting area of the scan line and the data line in the organic light emitting diode panel 210. In the drawing, a pixel including subpixels SR1, SG1, SB1 and SW1 of RGBW is shown.

FIG. 6B illustrates a circuit of any one subpixel in the pixel of the organic light emitting diode panel of FIG. 6A.

Referring to drawing, an organic light emitting sub pixel circuit (CRTm) may include, as an active type, a switching transistor SW1, a storage capacitor Cst, a drive transistor SW2, and an organic light emitting layer (OLED).

The switching transistor SW1 is turned on according to the input scan signal Vdscan, as a scan line is connected to a gate terminal. When it is turned on, the input data signal Vdata is transferred to the gate terminal of the drive transistor SW2 or one end of the storage capacitor Cst.

The storage capacitor Cst is formed between the gate terminal and the source terminal of the drive transistor SW2 and stores a certain difference between a data signal level transmitted to one end of the storage capacitor Cst and a DC power (VDD) level transmitted to the other terminal of the storage capacitor Cst.

For example, when the data signal has a different level according to a Plume Amplitude Modulation (PAM) method, the power level stored in the storage capacitor Cst varies according to the level difference of the data signal Vdata.

For another example, when the data signal has a different pulse width according to a Pulse Width Modulation (PWM) method, the power level stored in the storage capacitor Cst varies according to the pulse width difference of the data signal Vdata.

The drive transistor SW2 is turned on according to the power level stored in the storage capacitor Cst. When the drive transistor SW2 is turned on, the driving current (IOLED), which is proportional to the stored power level, flows in the organic light emitting layer (OLED). Accordingly, the organic light emitting layer OLED performs a light emitting operation.

The organic light emitting layer OLED may include a light emitting layer (EML) of RGBW corresponding to a subpixel and may include at least one of a hole injecting layer (HIL), a hole transporting layer (HTL), an electron transporting layer (ETL), or an electron injecting layer (EIL). In addition, it may include a hole blocking layer, and the like.

Meanwhile, all the subpixels emit a white light in the organic light emitting layer OLED. However, in the case of green, red, and blue subpixels, a subpixel is provided with a separate color filter for color implementation. That is, in the case of green, red, and blue subpixels, each of the subpixels further includes green, red, and blue color filters. Meanwhile, since a white subpixel outputs a white light, a separate color filter is not required.

Meanwhile, in the drawing, it is illustrated that a p-type MOSFET is used for the switching transistor SW1 and the drive transistor SW2, but an n-type MOSFET or other switching element such as a JFET, IGBT, SIC, or the like are also available.

Meanwhile, the pixel is a hold type element that continuously emits light in the organic light emitting layer (OLED), after a scan signal is applied, during a unit display period, specifically, during a unit frame.

Figure 7A:
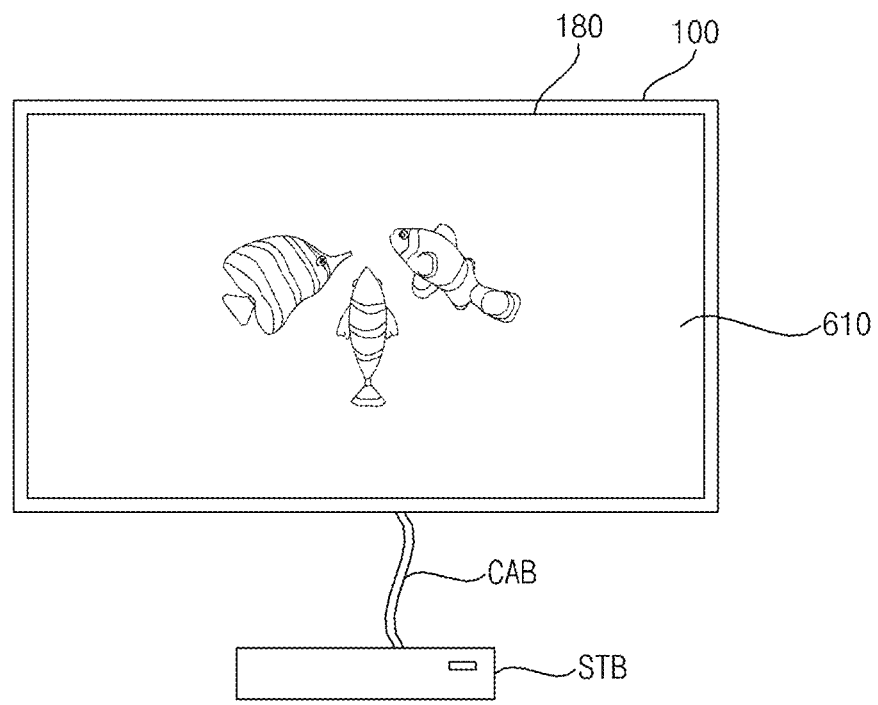
FIGS. 7A to 7B are diagrams for explaining a case in which an image display apparatus is connected to an external apparatus through a cable.
Figure 7B:
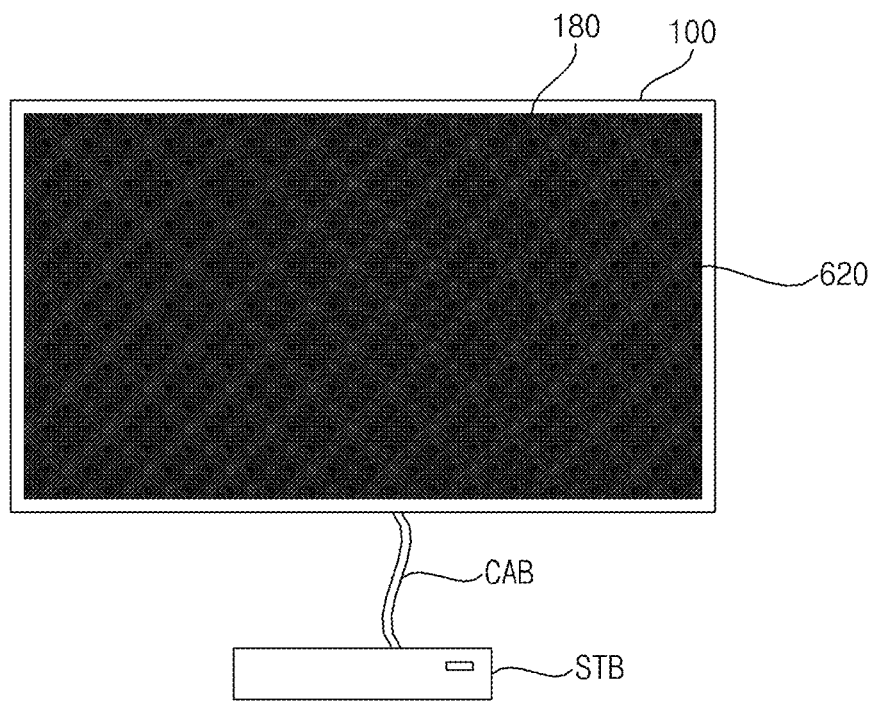

FIGS. 7A to 7B are diagrams for explaining a case in which an image display apparatus is connected to an external apparatus through a cable.

First, FIG. 7A shows an example in which the image display apparatus 100 and an external apparatus STB are connected to each other through a cable CAB.

The image display apparatus 100 may process a signal received from the external apparatus STB to display an external input image 610 as shown in the figure.

Next, FIG. 7B shows an example in which an image displayed on the image display apparatus 100 flickers, or the image is not displayed while the image display apparatus 100 is connected to the external apparatus STB though the cable CAB.

The figure shows a case in which image display is not performed, and a black image 620 is shown.

Meanwhile, while the image display apparatus 100 is connected to the external apparatus STB, if an image displayed on the image display apparatus 100 flickers or an image is not displayed, it is difficult to determine whether the external apparatus STB or the cable CAB is defective.

In this respect, the present disclosure proposes a method for determining whether a cable CAB is defective.

Figure 8:
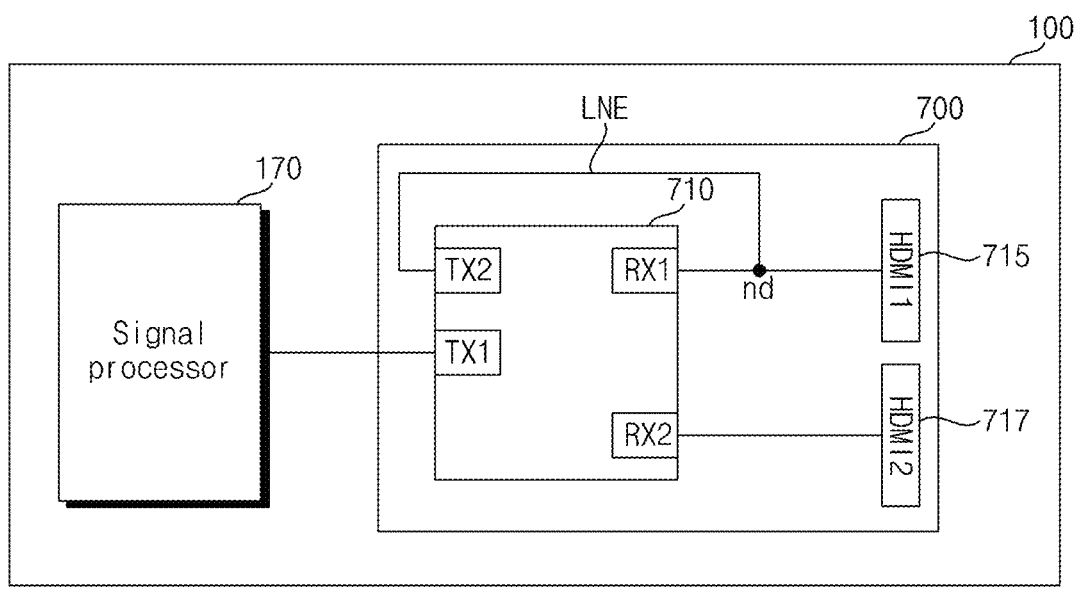
FIG. 8 is one example of an internal block diagram of an image display apparatus according to one embodiment of the present disclosure.

FIG. 8 is one example of an internal block diagram of an image display apparatus according to one embodiment of the present disclosure.

Referring to the figure, the image display apparatus 100 according to one embodiment of the present disclosure may include a signal processor 170 and an interface 700 connected to an external apparatus.

Meanwhile, the interface 700 may correspond to the external apparatus interface 130 of FIG. 2.

Meanwhile, an interface 700 according to one embodiment of the present disclosure comprises a plurality of input terminals; and a switching circuit 710 including a first receiving end RX1 receiving a signal through a first input terminal 715 among the plurality of input terminals, a second receiving end RX2 receiving a signal through a second input terminal 717 among the plurality of input terminals, a first transmitting end TX1 transmitting a signal received through the first receiving end RX1 or the second receiving end RX2 to a signal processor 170, and a second transmitting end TX2 outputting an output signal to the first input terminal 715 when a cable CAB is connected between the first input terminal 715 and the second input terminal 717, and a signal is not received.

Meanwhile, the interface 700 according to one embodiment of the present disclosure may further include an electric line LNE connecting the second transmitting end TX2 and a first node nd between the first receiving end RX1 and the first input terminal 715.

Meanwhile, when a cable CAB is connected between the first input terminal 715 and the second input terminal 717, and a signal is not received, the switching circuit 710 may compare an output signal output to the first input terminal 715 and an input signal received through the second receiving end RX2 and, in response to the difference between the output signal and the input signal being more than a predetermined value, determines that the cable CAB is defective. Accordingly, it is possible to determine whether a cable CAB connected to an input terminal is defective.

Alternatively, when a cable CAB is connected between the first input terminal 715 and the second input terminal 717, and a signal is not received, the signal processor 170 may compare an output signal output to the first input terminal 715 and an input signal received through the second receiving end RX2 and, in response to the difference between the output signal and the input signal being more than a predetermined value, determines that the cable CAB is defective. Accordingly, it is possible to determine whether a cable CAB connected to an input terminal is defective.

Meanwhile, in response to a determination that the cable CAB is defective, the signal processor 170 may control to display a screen display stop message or a cable defect message.

Accordingly, meanwhile, the display 180 within the image display apparatus 100 according to one embodiment of the present disclosure may display a screen display stop message or a cable defect message when the cable CAB is defective. Accordingly, it is possible to easily check whether a cable CAB is defective.

Meanwhile, the first transmitting end TX1 is electrically connected to the signal processor 170 while the second transmitting end TX2 is not electrically connected to the signal processor 170.

Meanwhile, the first transmitting end TX1 is electrically connected to the first receiving end RX1 and the second receiving end RX2 while the second transmitting end TX2 is not electrically connected to the second receiving end RX2.

Meanwhile, the interface 700 within the image display apparatus 100 according to another embodiment of the present disclosure comprises a plurality of input terminals; and a switching circuit 710, in response to receiving a signal through the first input terminal 715 or the second input terminal 717 among the plurality of input terminals, operates in a normal mode and transmits the received signal to the signal processor 170 through the first transmitting end TX1 and enters a check mode and outputs a test signal to the first input terminal 715 when a cable CAB is connected between the first input terminal 715 and the second input terminal 717, and a signal is not received. Accordingly, it is possible to determine whether a cable CAB connected to an input terminal is defective.

Meanwhile, the switching circuit 710 according to another embodiment of the present disclosure may compare a signal received through the second input terminal 717 with a test signal in response to the test signal in the check mode and, in response to the difference between the output signal and the input signal being more than a predetermined value, determine that the cable CAB is defective. Accordingly, it is possible to determine whether a cable CAB connected to an input terminal is defective.

Meanwhile, the signal processor 170 according to another embodiment of the present disclosure may compare a signal received through the second input terminal 717 with a test signal in response to the test signal in the check mode and, in response to the difference between the output signal and the input signal being more than a predetermined value, determine that the cable CAB is defective. Accordingly, it is possible to determine whether a cable CAB connected to an input terminal is defective.

Meanwhile, the first input terminal 715 and the second input terminal 717 of FIG. 8 are of the same type and may be, for example, HDMI ports.

Figure 9:
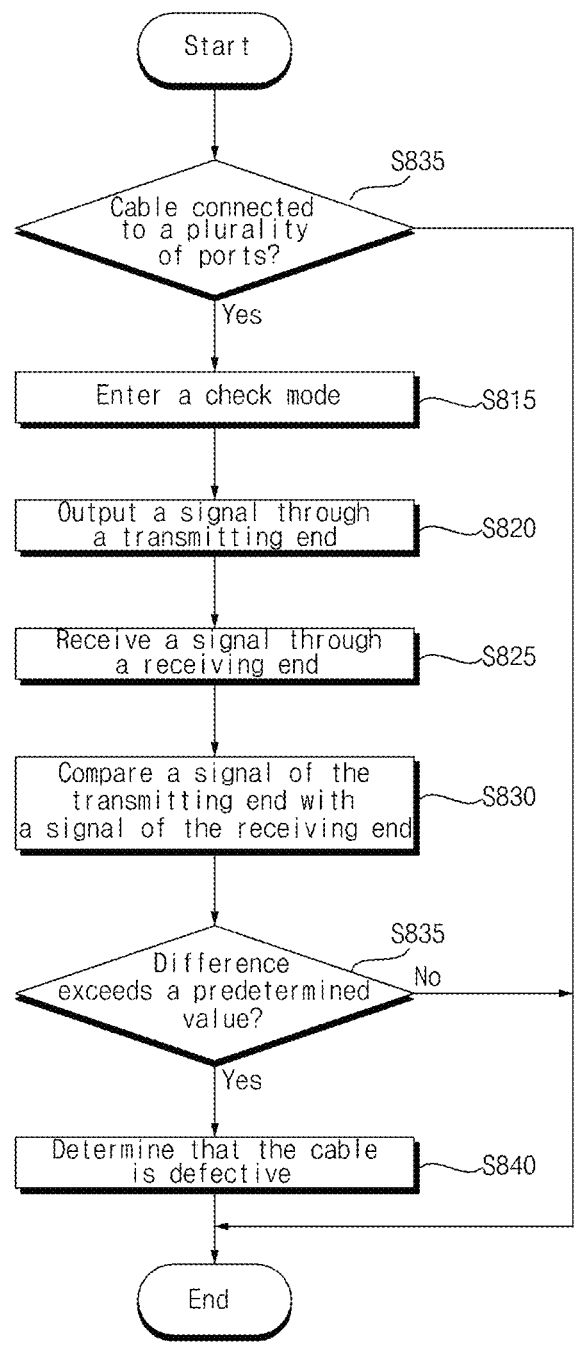
FIG. 9 is a flow diagram illustrating a method for operating an image display apparatus according to one embodiment of the present disclosure.
Figure 10A:
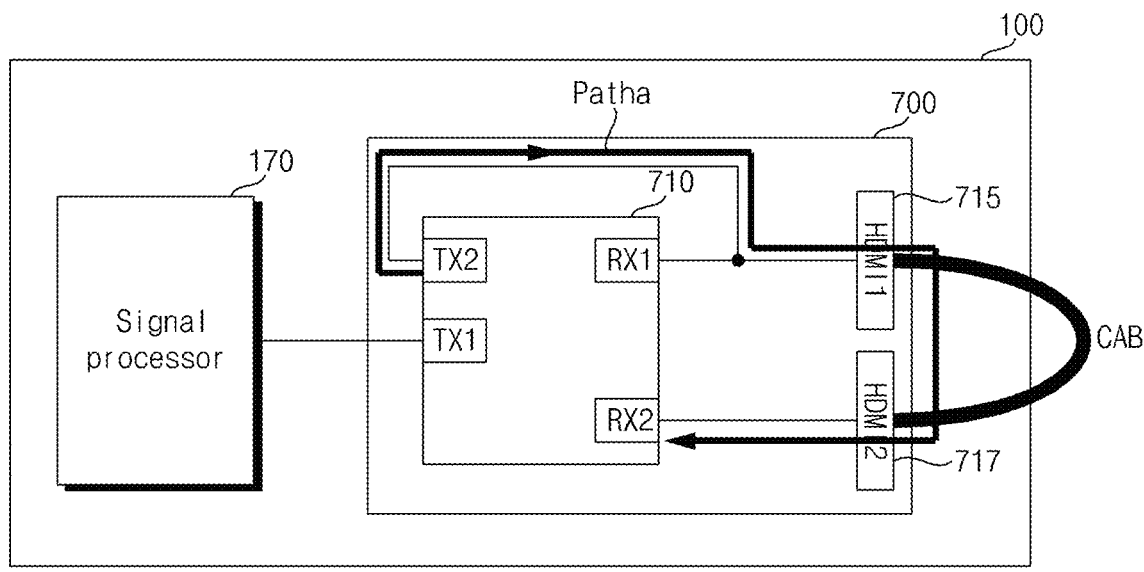
FIGS. 10A to 11 are diagrams referenced for the description of FIG. 9.
Figure 10B:
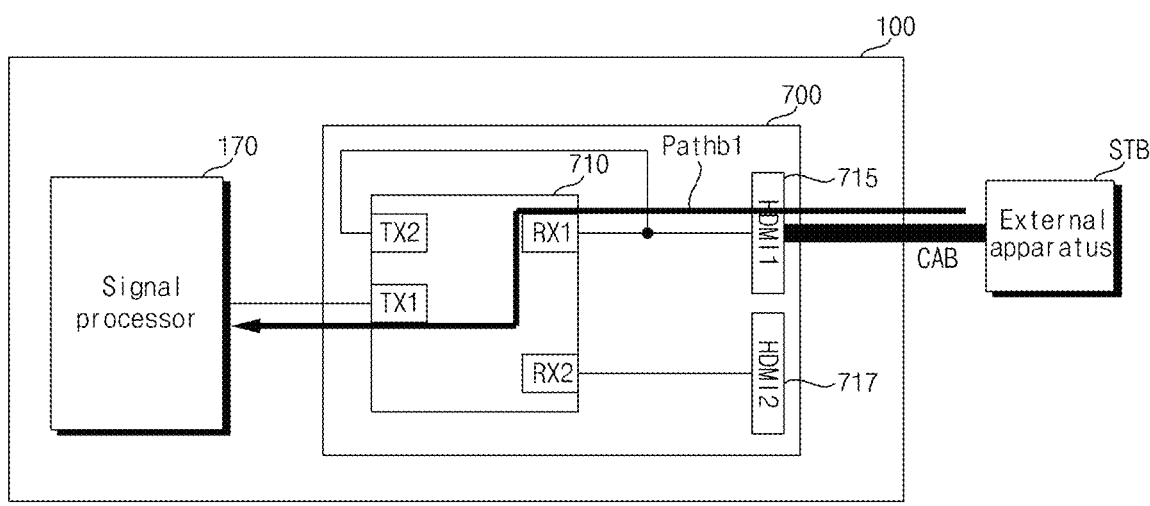
Figure 10C:
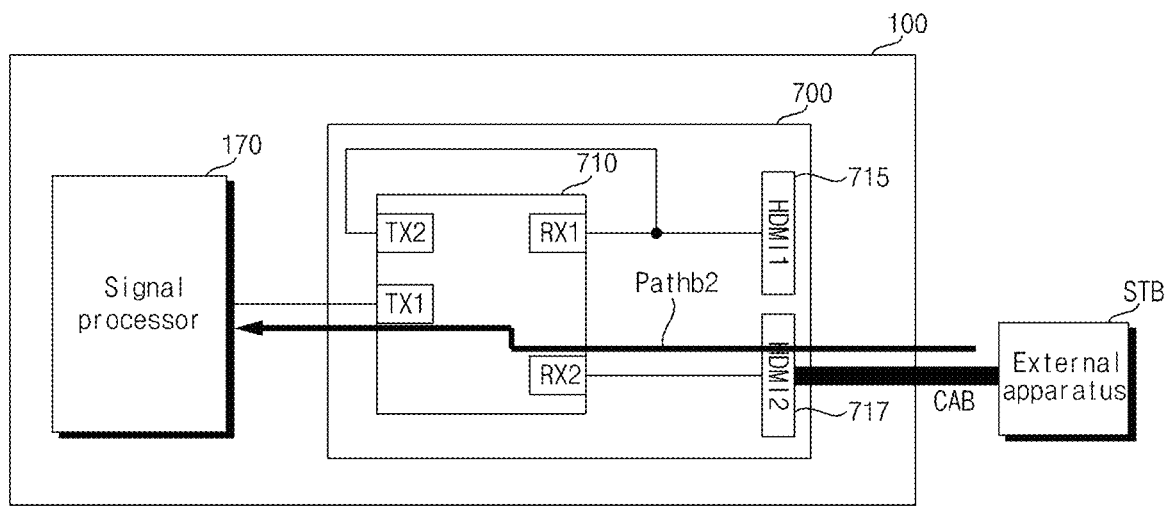
Figure 10D:
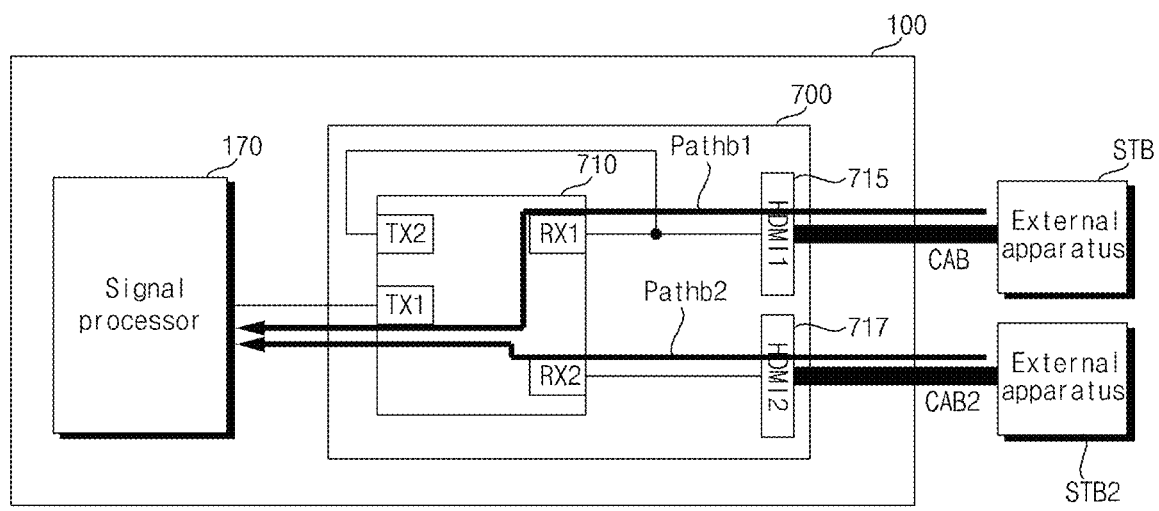
Figure 11:
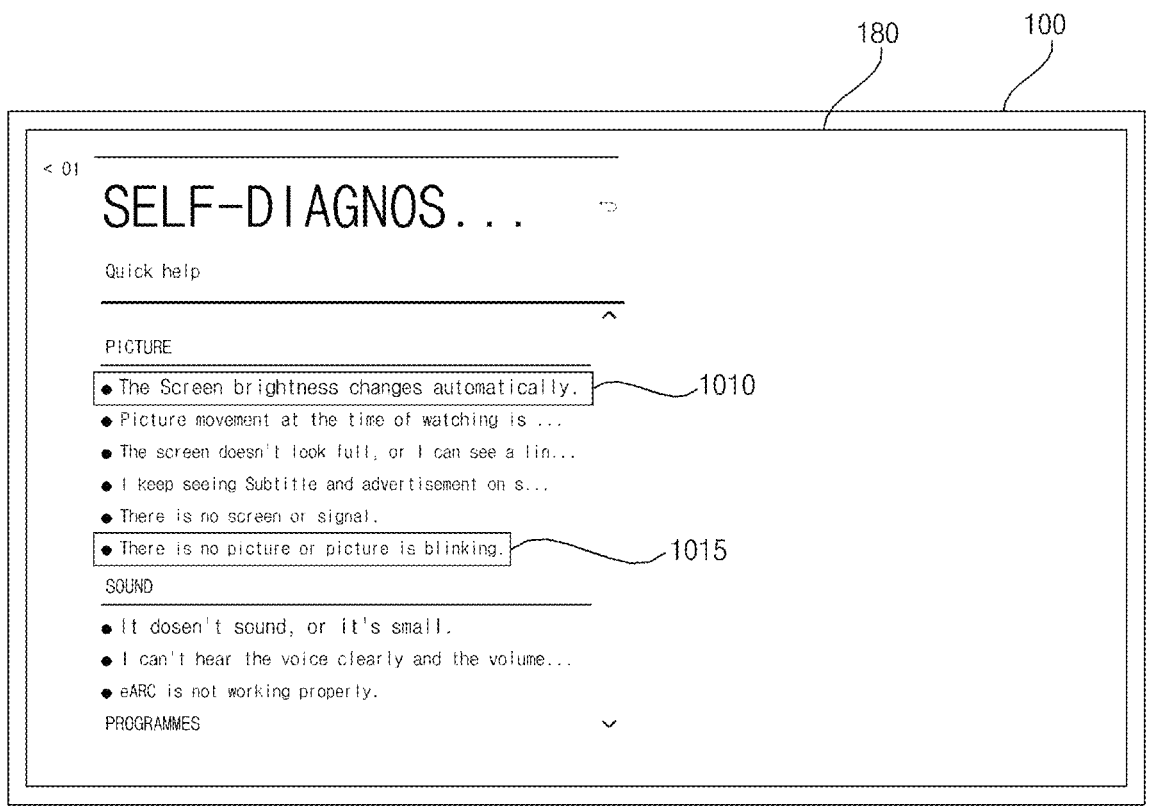

FIG. 9 is a flow diagram illustrating a method for operating an image display apparatus according to one embodiment of the present disclosure, and FIGS. 10A to 11 are diagrams referenced for the description of FIG. 9.

First, referring to FIG. 9, the switching circuit 710 determines whether a cable is connected to a plurality of input terminals S835.

In particular, while a cable is connected to the plurality of input terminals, the switching circuit 710 determines whether a signal is received or not.

Each of the plurality of input terminals is provided with a voltage detection circuit or a current detection circuit, through which it is possible to detect whether a cable is connected.

On the other hand, the switching circuit 710 determines whether a cable CAB is connected between the first input terminal 715 and the second input terminal 717 among the plurality of input terminals, and a signal is received.

When a first cable is connected to the first input terminal 715, and a second cable is connected to the second input terminal 717, and a signal is received through each cable, the switching circuit 710 may transmit the signal received in the normal mode to the signal processor 170 through the first transmitting end.

Meanwhile, when a cable CAB is connected between the first input terminal 715 and the second input terminal 717 among the plurality of input terminals, and a signal is not received, the switching circuit 710 enters a cable CAB check mode S815.

Accordingly, the first transmitting end TX1 of the switching circuit 710 may output a signal S820. At this time, the signal may be a test signal.

An output signal output from the first transmitting end TX1 may be transmitted to the first input terminal 715 through the first node nd along the electric line LNE.

Meanwhile, when a common cable CAB is connected between the first input terminal 715 and the second input terminal 717, an output signal output from the first transmitting end TX1 may be transmitted to the second receiving end RX1 through the first input terminal 715 and the second input terminal 717.

Next, the second receiving end RX1 of the switching circuit 710 may receive a signal corresponding to the test signal S825.

And the switching circuit 710 may compare an output signal output from the first transmitting end TX1 with the signal received by the second receiving end RX1 S830, and when the comparison yields a difference below a predetermined value, it may be determined that the cable CAB is normal.

Meanwhile, when the comparison yields a difference exceeding a predetermined value, the switching circuit 710 or the signal processor 170 may determine that the cable CAB is defective S840. Accordingly, it is possible to determine whether a cable CAB connected to an input terminal is defective.

And the signal processor 170 may control to display a screen display stop message or a cable defect message. Accordingly, it is possible to easily check whether a cable CAB is defective.

Meanwhile, FIG. 10A illustrates a case in which a cable CAB is connected between the first input terminal 715 and the second input terminal 717.

As shown in the figure, when a cable CAB is connected between the first input terminal 715 and the second input terminal 717, and a signal is not received, the switching circuit 710 may enter the cable CAB check mode, and the first transmitting end TX1 may output an output signal.

Accordingly, the output signal output from the first transmitting end TX1 may be transmitted to the second receiving end RX2 along a current path Patha comprising the electric line LNE, the first node nd, the first input terminal 715, and the second input terminal 717.

Accordingly, the switching circuit 710 or the signal processor 170 may compare the output signal output from the first transmitting end TX1 with a signal received by the second receiving end RX2 and determine whether the cable CAB is defective based on a difference from the comparison result.

Meanwhile, FIG. 10B shows a case in which a cable CAB is connected to the first input terminal 715 while a cable CAB is not connected to the second input terminal 717.

As shown in the figure, when a cable CAB is connected to the first input terminal 715, an external input signal from an external apparatus STB may be transmitted to the signal processor 170 along a current path Pathb1 comprising the cable CAB, the first input terminal 715, the first receiving end RX1, and the first transmitting end TX1.

Accordingly, the signal processor 170 may control to process an external input signal from the external apparatus STB and display an external input image corresponding to the external input signal on the display 180.

Meanwhile, when an image displayed on the display 100 flickers, or an image is not displayed while a cable CAB is connected to the first input terminal 715, and the external input signal is received, the signal processor 170 may control to enter the cable check mode.

For example, as shown in FIG. 10A, the signal processor 170 may control to display a guide message guiding to connect a cable CAB between the first input terminal 715 and the second input terminal 717.

As shown in FIG. 10A, if a common cable CAB is connected between the first input terminal 715 and the second input terminal 717, the signal processor 170 may enter the cable check mode and determine whether the cable is defective.

Meanwhile, FIG. 10C illustrates a case in which a cable CAB is connected to the second input terminal 717 while a cable CAB is not connected to the first input terminal 715.

As shown in the figure, when a cable CAB is connected to the second input terminal 717, an external input signal from an external apparatus STB may be transmitted to the signal processor 170 along a current path Pathb2 comprising the cable CAB, the second input terminal 717, the second receiving end RX2, and the first transmitting end TX1.

Accordingly, the signal processor 170 may control to process an external input signal from the external apparatus STB and display an external input image corresponding to the external input signal on the display 180.

Meanwhile, when an image displayed on the display 100 flickers, or an image is not displayed while a cable CAB is connected to the second input terminal 717, and the external input signal is received, the signal processor 170 may control to enter the cable check mode.

For example, as shown in FIG. 10A, the signal processor 170 may control to display a guide message guiding to connect a cable CAB between the first input terminal 715 and the second input terminal 717.

As shown in FIG. 10A, if a common cable CAB is connected between the first input terminal 715 and the second input terminal 717, the signal processor 170 may enter the cable check mode and determine whether the cable is defective.

Meanwhile, FIG. 10D illustrates a case in which a cable CAB is connected to the first input terminal 715, and a second cable CAB2 is connected to the second input terminal 717.

As shown in the figure, when the cable CAB is connected to the first input terminal 715, and the second cable CAB2 is connected to the second input terminal 717, an external input signal from the external apparatus STB may be transmitted to the signal processor 170 along a current path Pathb1 comprising the cable CAB, the first input terminal 715, the first receiving end RX1, and the first transmitting end TX1; and a second external input signal from a second external apparatus STB2 may be transmitted to the signal processor 170 along a current path Pathb2 comprising the second cable CAB2, the second input terminal 717, the second receiving end RX2, and the first transmitting end TX1.

Meanwhile, when the first cable CAB connected to the external apparatus STB is connected to the first input terminal 715, and the second cable CAB2 connected to the second external apparatus STB2 is connected to the second input terminal 717, a signal received through the first receiving end RX1 and a signal received through the second receiving end RX2 may be transmitted to the signal processor 170 through the first transmitting end TX1 using time division. Accordingly, a signal received through the first input terminal 715 and the second input terminal 717 may be processed.

Accordingly, the signal processor 170 may control to process the external input signal and the second external input signal from the external apparatus STB and the second external apparatus STB2, respectively and to display an external input image and a second external input image corresponding to the external input signal and the second external input signal together.

Meanwhile, when the cable CAB is connected to the first input terminal 715, and the second cable CAB2 is connected to the second input terminal 717, the signal processor 170 may control to enter the cable check mode if an image displayed on the image display apparatus 100 flickers or an image is not displayed while the external input signal and the second external input signal are being received.

For example, as shown in FIG. 10A, the signal processor 170 may control to display a guide message guiding to connect the cable CAB or the second cable CAB2 between the first input terminal 715 and the second input terminal 717.

As shown in FIG. 10A, when a common cable CAB or the second cable CAB2 is connected between the first input terminal 715 and the second input terminal 717, the signal processor 170 may enter the cable check mode to determine whether the cable CAB or the second cable CAB2 is defective. Accordingly, it is possible to easily determine whether a cable is defective.

FIG. 11 illustrates a case in which a screen display stop message 1010 or a cable defect message 1015 is displayed on the display 180 of the image display apparatus 100. When a screen display is stopped or flickers while an image is being displayed, the signal processor 170 may control to display the screen display stop message 1010. And the signal processor 170 may control to enter the cable check mode.

Meanwhile, as shown in FIG. 8 or FIG. 10A, when the cable check mode is executed, and it is determined that the cable is defective, while the cable CAB is connected between the first input terminal 715 and the second input terminal 717, the signal processor 170 may control to display the cable defect message 1015. Accordingly, it is possible to easily check whether a cable CAB is defective.

While the present disclosure has been particularly shown and described with reference to exemplary embodiments thereof, it is clearly understood that the present disclosure is not limited to the specific embodiment described above, and various modifications are available to those ordinary skilled in the art without departing from the subject matter claimed in the accompanying claims. Further, the various modifications should not be individually understood from the technical concept or prospect of the present disclosure.

INDUSTRIAL APPLICABILITY

The present disclosure may be applied to an image display apparatus.

What is claimed is:

1. An image display apparatus comprising:
   a plurality of input terminals; and
   a switching circuit including a first receiving end configured to receive a signal through a first input terminal among the plurality of input terminals, a second receiving end configured to receive a signal through a second input terminal among the plurality of input terminals, a first transmitting end configured to transmit a signal received through the first receiving end or the second receiving end to a signal processor, and a second transmitting end configured to output an output signal to the first input terminal in response to a cable being connected between the first input terminal and the second input terminal, and a signal being not received.

2. The image display apparatus of claim 1, wherein, in response to the cable being connected between the first input terminal and the second input terminal, and a signal being not received, the switching circuit is configured to compare an output signal output to the first input terminal with an input signal received through the second receiving end and, in response to the difference between the output signal and the input signal being more than a predetermined value, determine that the cable is defective.

3. The image display apparatus of claim 1, further including the signal processor configured to, in response to the cable being connected between the first input terminal and the second input terminal, and a signal being not received, compare an output signal output to the first input terminal with an input signal received through the second receiving end and, in response to the difference between the output signal and the input signal being more than a predetermined value, determine that the cable is defective.

4. The image display apparatus of claim 1, wherein, in response to a first cable connected to an external apparatus being connected to the first input terminal, the switching circuit transmits a signal received through the first cable to the signal processor through the first receiving end and the first transmitting end.

5. The image display apparatus of claim 1, wherein, in response to a second cable connected to a second external apparatus being connected to the second input terminal, the switching circuit transmits a signal received through the second cable to the signal processor through the second receiving end and the first transmitting end.

6. The image display apparatus of claim 1, wherein, in response to the first cable connected to the external apparatus being connected to the first input terminal, and the second cable connected to the second external apparatus being connected to the second input terminal, the switching circuit transmits a signal received through the first receiving end and a signal received through the second receiving end to the signal processor through the first transmitting end using time division.

7. The image display apparatus of claim 1 wherein the first transmitting end is electrically connected to the signal processor, and the second transmitting end is not electrically connected to the signal processor.

8. The image display apparatus of claim 1, wherein the first transmitting end is electrically connected to the first receiving end and the second receiving end, and
   the second transmitting end is not electrically connected to the second receiving end.

9. The image display apparatus of claim 1, further including an electrical line connecting the second transmitting end and a first node between the first receiving end and the first input terminal.

10. The image display apparatus of claim 2, further including a display configured to display a screen display stop message or a cable defect message in response to a determination that the cable is defective.

11. The image display apparatus of claim 3, further including a display configured to display a screen display stop message or a cable defect message in response to a determination that the cable is defective.

12. The image display apparatus of claim 3, wherein, the signal processor is configured to display a screen display stop message or a cable defect message in response to a determination that the cable is defective.

13. An image display apparatus comprising:
    a plurality of input terminals; and
    a switching circuit configured to, in response to receiving a signal through a first input terminal or a second input terminal among the plurality of input terminals, operate in a normal mode and transmit the received signal to a signal processor through a first transmitting end, and in response to a cable being connected between the first input terminal and the second input terminal, and a signal being not received, enter a check mode and output a test signal to the first input terminal.

14. The image display apparatus of claim 13, wherein the switching circuit is configured to compare a signal received through the second input terminal with the test signal in response to the test signal in the check mode and, in response to the difference between the output signal and the input signal being more than a predetermined value, determine that the cable is defective.

15. The image display apparatus of claim 13, further including the signal processor configured to compares a signal received through the second input terminal with the test signal in response to the test signal in the check mode and, in response to the difference between the output signal and the input signal being more than a predetermined value, determine that the cable is defective.

16. The image display apparatus of claim 14, further including a display configured to display a screen display stop message or a cable defect message in response to a determination that the cable is defective.

17. The image display apparatus of claim 15, further including a display configured to display a screen display stop message or a cable defect message in response to a determination that the cable is defective.

18. The image display apparatus of claim 15, wherein, in response to a determination that the cable is defective, the signal processor is configured to display a screen display stop message or a cable defect message.

* * * * *